US012812840B2

(12) United States Patent
Park et al.

(10) Patent No.: US 12,812,840 B2
(45) Date of Patent: Nov. 24, 2026

(54) SEMICONDUCTOR DEVICE HAVING LOW-BANDGAP INTERFACIAL LAYER IN THE CAPACITOR

(71) Applicant: SAMSUNG ELECTRONICS CO., LTD., Suwon-si (KR)

(72) Inventors: Jungmin Park, Suwon-si (KR); Hanjin Lim, Suwon-si (KR); Hyungsuk Jung, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 612 days.

(21) Appl. No.: 18/169,721

(22) Filed: Feb. 15, 2023

(65) Prior Publication Data

US 2023/0380141 A1 Nov. 23, 2023

(30) Foreign Application Priority Data

May 23, 2022 (KR) ........................ 10-2022-0063071

(51) Int. Cl.
*H10B 12/00* (2023.01)

(52) U.S. Cl.
CPC ......... *H10B 12/315* (2023.02); *H10B 12/033* (2023.02)

(58) Field of Classification Search
CPC .... H10B 12/315; H10B 12/033; H10D 1/694; H10D 1/696
See application file for complete search history.

(56) References Cited

U.S. PATENT DOCUMENTS 10,964,614 B2 * 3/2021 Lee ..................... H01L 23/5329
11,594,678 B2 * 2/2023 Zhong .................. H10N 70/828
2006/0014385 A1 * 1/2006 Kim ........................ C23C 16/34 257/E21.648
2014/0264252 A1 9/2014 Hashim et al.
2015/0137315 A1 * 5/2015 Chen ...................... H10D 1/711 257/532
2020/0091275 A1 * 3/2020 Kim ....................... H10D 1/716
2021/0066446 A1 * 3/2021 Lee ........................ H10B 12/34
2021/0091169 A1 3/2021 Lin et al.
2021/0134804 A1 * 5/2021 Jung ................. H01L 21/76897
2022/0013623 A1 1/2022 Bang et al.

FOREIGN PATENT DOCUMENTS

KR 10-2021-0053379 A 5/2021
TW 202135063 A 9/2021
WO 2010110803 A1 9/2010

OTHER PUBLICATIONS

"First Office Action", TW Application No. 112117424, Oct. 17, 2023, 8 pp.

* cited by examiner

*Primary Examiner* — Steven M Page
(74) *Attorney, Agent, or Firm* — Wolf, Greenfield & Sacks, P.C.

(57) ABSTRACT

A semiconductor device includes an upper electrode, a lower electrode, a dielectric layer between the upper electrode and the lower electrode, and a low-bandgap interfacial layer including at least one of a first low-bandgap interfacial layer between the dielectric layer and the upper electrode and a second low-bandgap interfacial layer between the dielectric layer and the lower electrode, wherein each of the first low-bandgap interfacial layer and the second low-bandgap interfacial layer includes a metal oxide having a bandgap energy of more than about 2.5 eV and less than or equal to about 3.5 eV.

18 Claims, 34 Drawing Sheets

SEMICONDUCTOR DEVICE HAVING LOW-BANDGAP INTERFACIAL LAYER IN THE CAPACITOR

CROSS-REFERENCE TO RELATED APPLICATION

This application is based on and claims priority under 35 U.S.C. § 119 to Korean Patent Application No. 10-2022-0063071, filed on May 23, 2022, in the Korean Intellectual Property Office, the disclosure of which is incorporated by reference herein in its entirety.

BACKGROUND

The inventive concept relates to semiconductor devices, and more particularly, to semiconductor devices including capacitors.

As semiconductor memory devices are becoming more highly integrated, individual circuit patterns are being more miniaturized to implement more semiconductor devices on the same area. That is, as the integration density of semiconductor memory devices increases, the design rules for the semiconductor memory devices are reduced.

In the manufacture of a highly scaled semiconductor memory device, a process of forming capacitors becomes increasingly complicated and difficult. In miniaturized semiconductor devices, capacitors adopting known structures are reaching the technical limit for ensuring desired capacitance.

SUMMARY

The inventive concept provides a semiconductor device having a capacitor of which performance and reliability are improved.

Aspects of the inventive concept should not be limited by the above description, and other unmentioned aspects will be clearly understood by one of ordinary skill in the art from example embodiments described herein.

According to an aspect of the inventive concept, there is provided a semiconductor device. The semiconductor device includes an upper electrode, a lower electrode, a dielectric layer between the upper electrode and the lower electrode, and a low-bandgap interfacial layer including at least one of a first low-bandgap interfacial layer between the dielectric layer and the upper electrode and a second low-bandgap interfacial layer between the dielectric layer and the lower electrode, wherein each of the first low-bandgap interfacial layer and the second low-bandgap interfacial layer includes a metal oxide having a bandgap energy of more than about 2.5 eV and less than or equal to about 3.5 eV.

According to another aspect of the inventive concept, there is provided a semiconductor device. The semiconductor device includes a substrate, an active region defined by a device isolation film formed in the substrate, a word line intersecting with the active region, the word line extending in a first direction in the substrate, a bit line extending in a second direction on the substrate, the second direction intersecting with the first direction, and a capacitor extending in a third direction on the bit line, wherein the capacitor includes an upper electrode, a lower electrode, a dielectric layer between the upper electrode and the lower electrode, and a low-bandgap interfacial layer including at least one of a first low-bandgap interfacial layer between the dielectric layer and the upper electrode and a second low-bandgap interfacial layer between the dielectric layer and the lower electrode, wherein each of the first low-bandgap interfacial layer and the second low-bandgap interfacial layer includes a metal oxide having a bandgap energy of more than about 2.5 eV and less than or equal to about 3.5 eV.

According to another aspect of the inventive concept, there is provided a semiconductor device. The semiconductor device includes a substrate, an active region defined by a device isolation film formed in the substrate, a word line intersecting with the active region, the word line extending in a first direction in the substrate, a bit line extending in a second direction on the substrate, the second direction intersecting with the first direction, and a capacitor extending in a third direction on the bit line, wherein the capacitor includes an upper electrode, a lower electrode, a dielectric layer between the upper electrode and the lower electrode, and a low-bandgap interfacial layer including at least one of a first low-bandgap interfacial layer between the dielectric layer and the upper electrode and a second low-bandgap interfacial layer between the dielectric layer and the lower electrode, wherein the first low-bandgap interfacial layer includes a first metal dopant, which is in an oxidized state in a form of a first metal oxide having a bandgap energy of more than about 2.5 eV and less than or equal to about 3.5 eV, and the second low-bandgap interfacial layer includes a second metal dopant, which is in an oxidized state in a form of a second metal oxide having a bandgap energy of more than about 2.5 eV and less than or equal to about 3.5 eV.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Embodiments will now be described more fully with reference to the accompanying drawings to fully understood advantages and features of the inventive concept. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the accompanying drawings, components are enlarged in size more than actual sizes for brevity, and a ratio of each component may be exaggerated or reduced.

In embodiments, unless otherwise defined, all terms used herein have the same meaning as commonly understood by one of ordinary skill in the art to which this inventive concept belongs. Terms such as, "first", "second", and "third", may be used to describe various elements, but these elements are not limited by these above terms. These terms are only used to distinguish one element from another. Therefore, a "first" element" may be referred to as a "second" element without departing from the teachings of the present disclosure. Terms such as "upper", "middle", and "lower", may be replaced with other terms, for example, "first", "second", and "third", to describe elements in the specification.

The inventive concept will now be described more fully hereinafter with reference to the accompanying drawings, in which some embodiments are shown.

Figure 1:
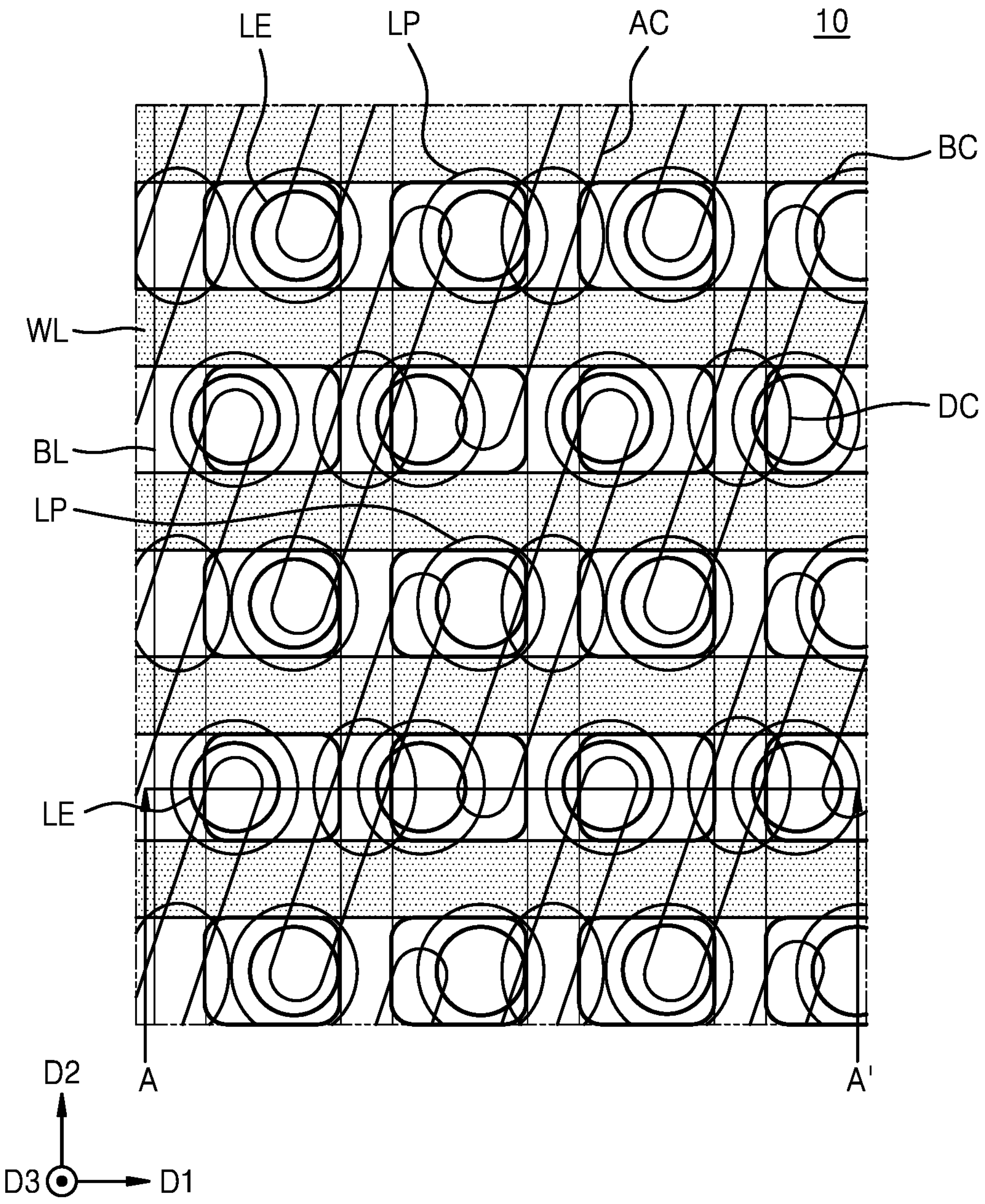
FIG. 1 illustrates a plan layout of some components of a memory cell array region of a semiconductor device according to embodiments.

FIG. 1 illustrates a plan layout of some components of a memory cell array region of a semiconductor device 10 according to embodiments.

Referring to FIG. 1, the semiconductor device 10 may include a plurality of active regions AC, which laterally extend in a diagonal direction with respect to a first direction D1 and a second direction D2 in a view from above. A plurality of word lines WL may intersect with the plurality of active regions AC and extend parallel to each other in the first direction D1. On the plurality of word lines WL, a plurality of bit lines BL may extend parallel to each other in the second direction D2 that intersects with the first direction D1. Each of the plurality of bit lines BL may be connected to the active region AC through a direct contact DC. Each of a plurality of buried contacts BC may be between two adjacent ones of the plurality of bit lines BL. A plurality of conductive landing pads LP may respectively be on the plurality of buried contacts BC. Each of the plurality of conductive landing pads LP may overlap at least a portion of the buried contact BC. A plurality of lower electrodes LE may be apart from each other on the plurality of conductive landing pads LP, respectively. The plurality of lower electrodes LE may be respectively connected to the plurality of active regions AC through the plurality of buried contacts BC and the plurality of conductive landing pads LP.

Figure 2A:
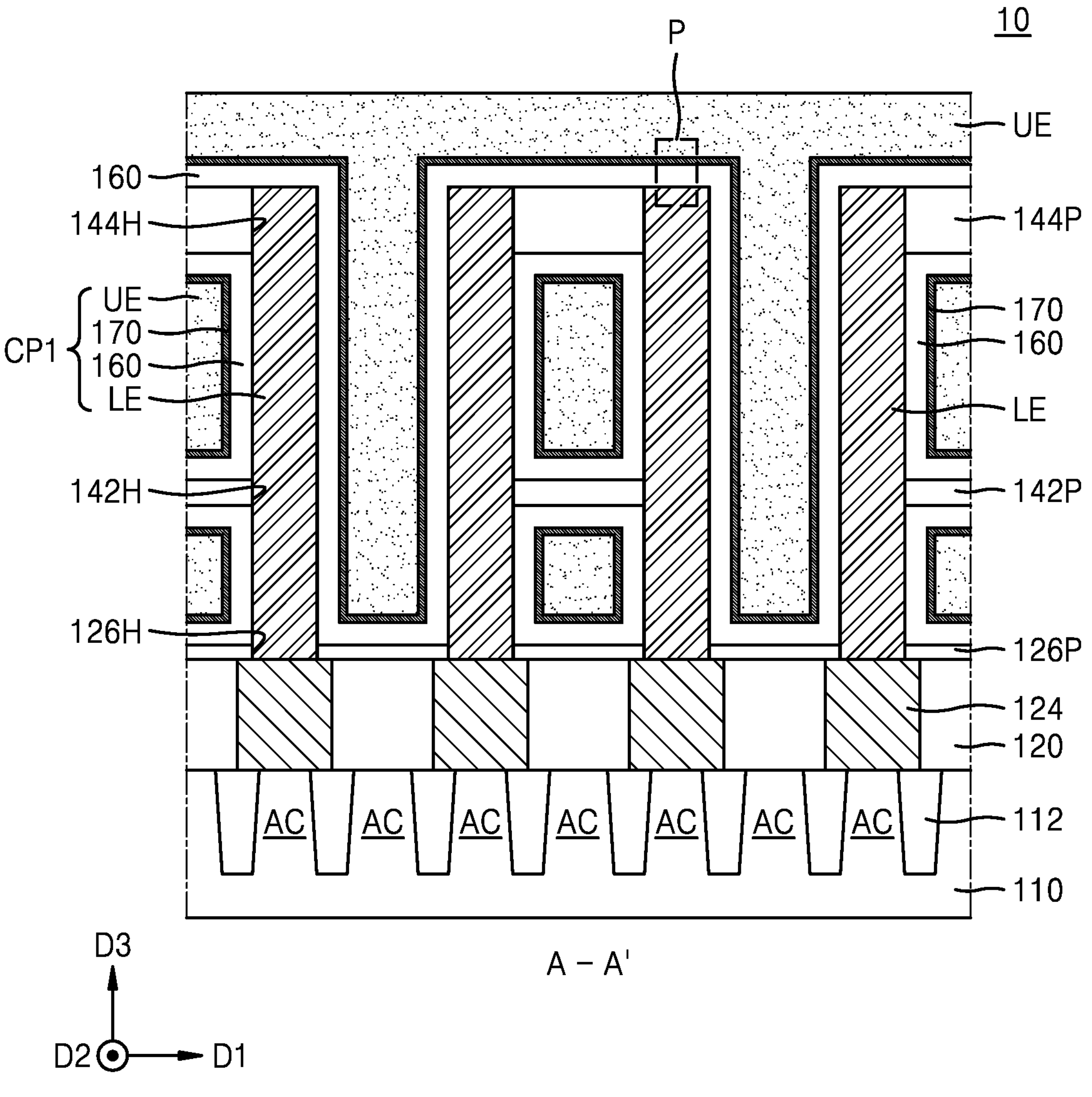
FIGS. 2A to 2C are cross-sectional views taken along line A-A' of FIG. 1, which illustrate some components of the semiconductor device according to the embodiments shown in FIG. 1.
Figure 2B:
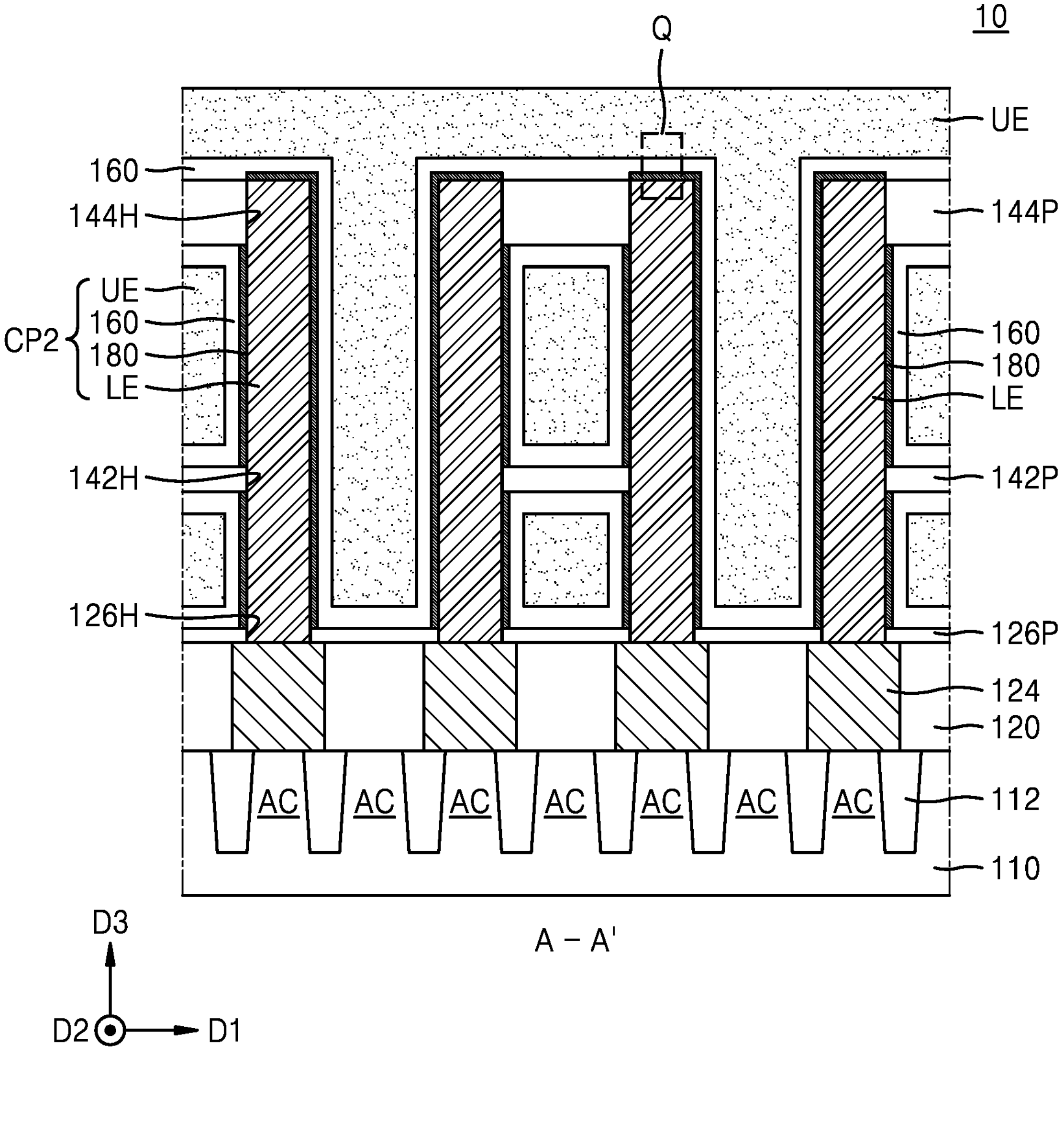
Figure 2C:
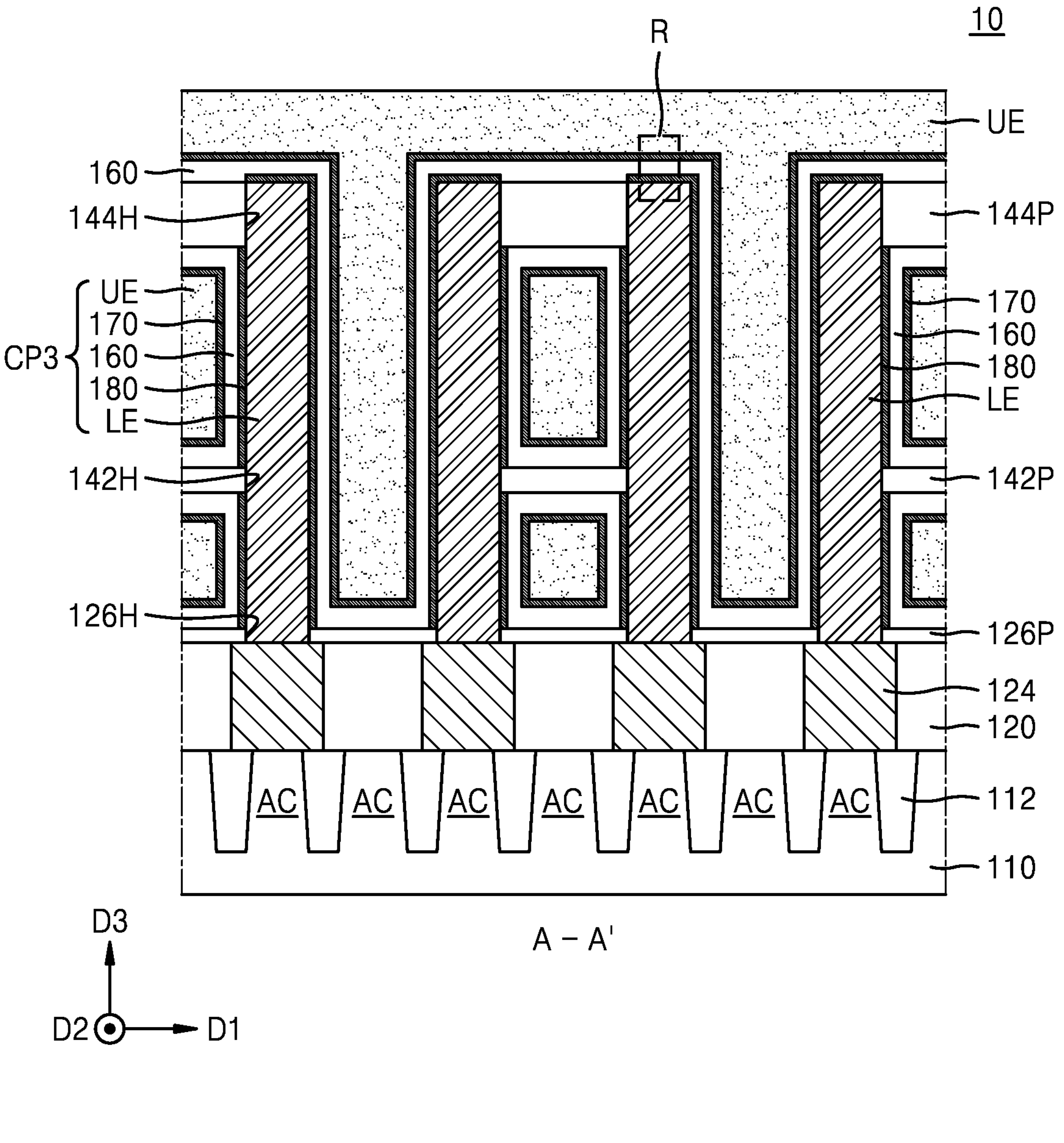

FIGS. 2A to 2C are each a cross-sectional view taken along line A-A' of FIG. 1, which illustrates some components of the semiconductor device 10 according to the embodiments shown in FIG. 1.

Referring to FIGS. 2A to 2C, the semiconductor device 10 may include a substrate 110 including a plurality of active regions AC and a lower structure 120 formed on the substrate 110. A plurality of conductive regions 124 may be connected to the plurality of active regions AC through the lower structure 120.

The substrate 110 may include a semiconductor element (e.g., silicon (Si) and germanium (Ge)) or a compound semiconductor (e.g., silicon carbide (SiC), gallium arsenide (GaAs), indium arsenide (InAs), and indium phosphide (InP)). The substrate 110 may include a semiconductor substrate and at least one insulating film or structure, including at least one conductive region, which are formed on the semiconductor substrate. The conductive region may include, for example, a doped well or a doped structure. A device isolation film 112 defining the plurality of active regions AC may be formed in the substrate 110. The device isolation film 112 may include an oxide film, a nitride film, or a combination thereof. In embodiments, the device isolation film 112 may have various structures, such as a shallow trench isolation (STI) structure.

In some embodiments, the lower structure 120 may include an insulating film, which includes a silicon oxide film, a silicon nitride film, or a combination thereof. In some other embodiments, the lower structure 120 may include various conductive regions, for example, wiring layers, contact plugs, and transistors, and insulating films configured to electrically insulate the conductive regions from each other. The plurality of conductive regions 124 may include polysilicon, a metal, a conductive metal nitride, a metal silicide, or a combination thereof. The lower structure 120 may include the plurality of bit lines BL described with reference to FIG. 1. Each of the plurality of conductive regions 124 may include the buried contact BC and the conductive landing pad LP, which have been described with reference to FIG. 1.

An insulating pattern 126P having a plurality of openings 126H may be on the lower structure 120 and the plurality of conductive regions 124 and overlap the plurality of conductive regions 124 in a third direction D3. The insulating pattern 126P may include a silicon nitride (SiN) film, a silicon carbonitride (SiCN) film, a silicon boron nitride (SiBN) film, or a combination thereof. As used herein, each of the terms "SiN," "SiCN," and "SiBN" refers to a material including elements included therein, without referring to a chemical formula representing a stoichiometric relationship.

A plurality of capacitors (e.g., CP1 to CP3) may be on the plurality of conductive regions 124. Each of the plurality of capacitors (e.g., CP1 to CP3) may include a lower electrode LE, a dielectric layer 160 on (e.g., covering) the lower electrode LE, and an upper electrode UE on (e.g., covering) the dielectric layer 160. The upper electrode UE may be apart from the lower electrode LE with the dielectric layer 160 therebetween.

Each of the plurality of capacitors (e.g., CP1 to CP3) may include a low-bandgap interfacial layer including at least one of a first low-bandgap interfacial layer 170 between the dielectric layer 160 and the upper electrode UE and a second low-bandgap interfacial layer 180 between the dielectric layer 160 and the lower electrode LE.

The insulating pattern 126P may be adjacent to a lower end of each of a plurality of lower electrodes LE. Each of the plurality of lower electrodes LE may have a pillar shape, which extends long from a top surface of the conductive region 124 through the opening 126H of the insulating pattern 126P in a direction away from the substrate 110 in the third direction D3. Although an example in which each of the plurality of lower electrodes LE has a pillar shape has been described with reference to FIGS. 2A to 2C, the inventive concept is not limited thereto. For example, each of the plurality of lower electrodes LE may include a sectional structure having a cup shape or a cylindrical shape with a closed bottom.

The plurality of lower electrodes LE may be supported by a lower supporter 142P and an upper supporter 144P. The plurality of lower electrodes LE may face the upper electrode UE with the dielectric layer 160 therebetween.

Referring to FIG. 2B, when the low-bandgap interfacial layer includes the second low-bandgap interfacial layer 180 between the lower electrode LE and the dielectric layer 160, the second low-bandgap interfacial layer 180 on the lower electrode LE may be formed only on a portion of the lower electrode LE, which faces the dielectric layer 160. The second low-bandgap interfacial layer 180 may not be formed on portions of the lower electrode LE, which respectively face the insulating pattern 126P, the lower supporter 142P, and the upper supporter 144P.

Referring to FIG. 2C, when the low-bandgap interfacial layer includes the first low-bandgap interfacial layer 170 as described with reference to FIG. 2A and the second low-bandgap interfacial layer 180 as described with reference to FIG. 2B, the first low-bandgap interfacial layer 170 on the dielectric layer 160 may be formed only on a portion of the dielectric layer 160, which faces the upper electrode UE, and the second low-bandgap interfacial layer 180 on the lower electrode LE may be formed only on a portion of the lower electrode LE, which faces the dielectric layer 160.

Referring to FIG. 2A, the dielectric layer 160 may cover the lower electrode LE, the lower supporter 142P, and the upper supporter 144P. The dielectric layer 160 may include portions in contact with the first low-bandgap interfacial layer 170 between the upper electrode UE and the dielectric layer 160, portions in contact with the insulating pattern 126P, portions in contact with the lower supporter 142P, and portions in contact with the upper supporter 144P.

Referring to FIG. 2B, the dielectric layer 160 may cover the second low-bandgap interfacial layer 180, the lower supporter 142P, and the upper supporter 144P. The dielectric layer 160 may include portions in contact with the second low-bandgap interfacial layer 180 between the lower electrode LE and the dielectric layer 160, portions in contact with the insulating pattern 126P, portions in contact with the lower supporter 142P, and portions in contact with the upper supporter 144P.

Referring to FIG. 2C, the dielectric layer 160 may be on the second low-bandgap interfacial layer 180, the lower supporter 142P, and the upper supporter 144P. The dielectric layer 160 may include portions in contact with the first low-bandgap interfacial layer 170 on the upper electrode UE, portions in contact with the second low-bandgap interfacial layer 180 on the lower electrode LE, portions in contact with the insulating pattern 126P, portions in contact with the lower supporter 142P, and portions in contact with the upper supporter 144P.

As shown in FIGS. 2A and 2C, when the low-bandgap interfacial layer includes the first low-bandgap interfacial layer 170 between the upper electrode UE and the dielectric layer 160, the portions of the dielectric layer 160, which are in contact with the first low-bandgap interfacial layer 170, may be apart from the upper electrode UE with the first low-bandgap interfacial layer 170 therebetween. Similarly, as shown in FIGS. 2B and 2C, when the low-bandgap interfacial layer includes the second low-bandgap interfacial layer 180 between the lower electrode LE and the dielectric layer 160, the portions of the dielectric layer 160, which are in contact with the second low-bandgap interfacial layer 180 on the lower electrode LE, may be apart from the lower electrode LE with the second low-bandgap interfacial layer 180 therebetween.

As shown in FIGS. 2A to 2C, the upper supporter 144P may be on (e.g., cover) an upper portion of each of the plurality of lower electrodes LE and extend parallel to the substrate 110. The plurality of lower electrodes LE formed in a plurality of lower holes (refer to LH in FIG. 6E) may pass through a plurality of upper supporters 144P formed in a plurality of holes 144H and may extend in the third direction D3. A sidewall of each of the plurality of the upper supporters 144P may be in contact with an outer sidewall of the lower electrode LE. A top surface of each of the plurality of lower electrodes LE may be coplanar with a top surface of the upper supporter 144P.

The lower supporter 142P may extend parallel to the substrate 110 between the substrate 110 and the upper supporter 144P. The plurality of lower electrodes LE formed in the plurality of lower holes (refer to LH in FIG. 6E) may pass through a plurality of lower supporters 142P formed in a plurality of holes 142H and may extend in the third direction D3. A sidewall of each of the plurality of the lower supporters 142P may be in contact with an outer sidewall of the lower electrode LE.

Each of the lower supporter 142P and the upper supporter 144P may include a silicon nitride (SiN) film, a silicon carbonitride (SiCN) film, a silicon boron nitride (SiBN) film, or a combination thereof. In embodiments, the lower supporter 142P and the upper supporter 144P may include the same material as each other. In other embodiments, the lower supporter 142P and the upper supporter 144P may include different materials from each other. In an example, each of the lower supporter 142P and the upper supporter 144P may include SiCN. In another example, the lower supporter 142P may include SiCN, and the upper supporter 144P may include SiBN. However, the inventive concept is not limited to the materials described above.

Figure 3A:
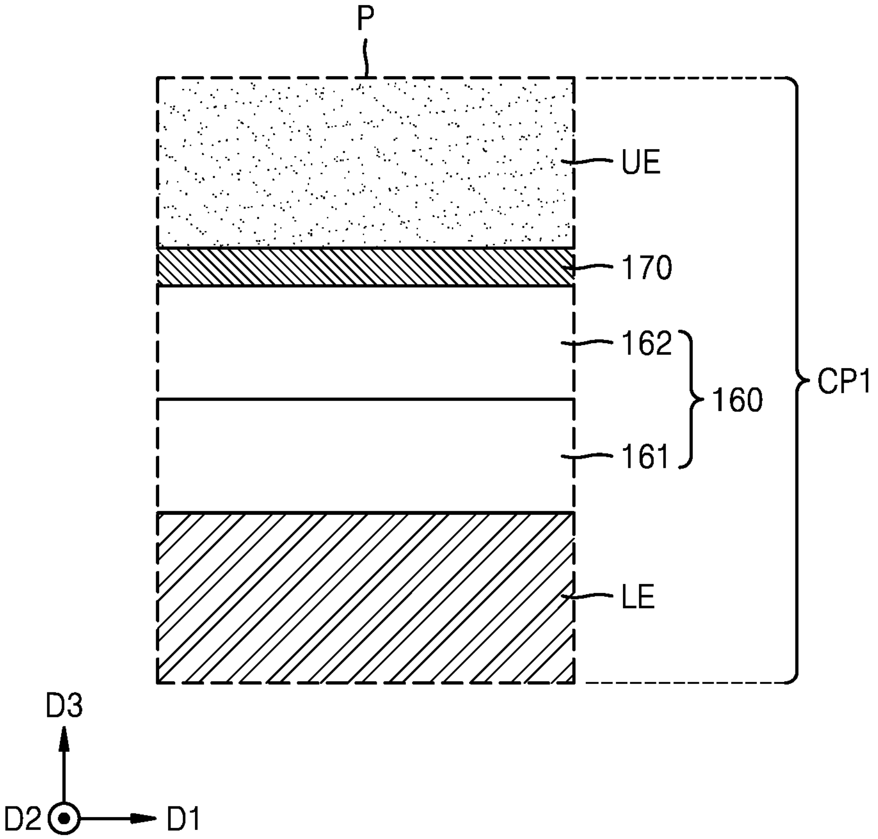
FIG. 3A is an enlarged cross-sectional view of region P of FIG. 2A.
Figure 3B:
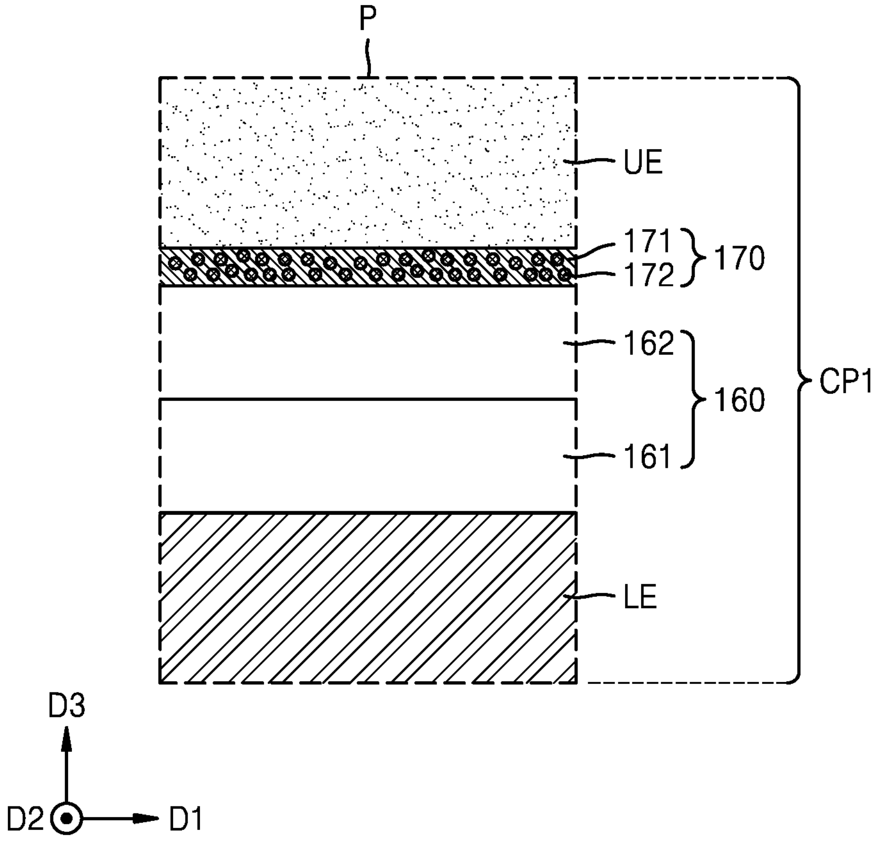
FIG. 3B is an enlarged cross-sectional view of another example structure of region P.

FIG. 3A is an enlarged cross-sectional view of region P of FIG. 2A, and FIG. 3B is another example structure of region P. FIGS. 3A and 3B are each an enlarged cross-sectional view of region P of FIG. 2A, according to embodiments, when a low-bandgap interfacial layer of the semiconductor device 10 may include a first low-bandgap interfacial layer 170 between an upper electrode UE and a dielectric layer 160 and does not include a second low-bandgap interfacial layer 180 between a lower electrode LE and the dielectric layer 160 as shown in FIG. 2A.

Referring to FIGS. 3A and 3B, a capacitor CP1 may include the lower electrode LE, the dielectric layer 160 on (e.g., covering) the lower electrode LE, the first low-bandgap interfacial layer 170 formed on the dielectric layer 160, and the upper electrode UE, which covers the first low-bandgap interfacial layer 170 and is apart from the lower electrode LE with the dielectric layer 160 therebetween. That is, in an embodiment, the capacitor CP1 of which a portion is shown in FIGS. 3A and 3B according to the inventive concept may include the first low-bandgap interfacial layer 170 between the upper electrode UE and the dielectric layer 160.

The lower electrode LE may include a metal-containing film including a first metal. The upper electrode UE may face the lower electrode LE with the dielectric layer 160 therebetween. In embodiments, the upper electrode UE may include the same metal as the first metal. In other embodiments, the upper electrode UE may include a different metal from the first metal.

Each of the lower electrode LE and the upper electrode UE may include a metal film, a conductive metal oxide film, a conductive metal nitride film, a conductive metal oxynitride film, or a combination thereof. In embodiments, each of the lower electrode LE and the upper electrode UE may include titanium (Ti), Ti oxide, Ti nitride, Ti oxynitride, niobium (Nb), Nb oxide, Nb nitride, Nb oxynitride, cobalt (Co), Co oxide, Co nitride, Co oxynitride, tin (Sn), Sn oxide, Sn nitride, Sn oxynitride, or a combination thereof. For example, each of the lower electrode LE and the upper electrode UE may include niobium nitride (NbN), titanium nitride (TiN), cobalt nitride (CoN), tin oxide ($SNO_2$), or a combination thereof. In other embodiments, each of the lower electrode LE and the upper electrode UE may include TaN, TiAlN, TaAlN, W, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCO), or a combination thereof. However, a constituent material of each of the lower electrode LE and the upper electrode UE is not limited to the examples described above.

A thickness of each of the lower electrode LE and the upper electrode UE may be greater than about 100 angstroms (Å). In embodiments, a thickness of the lower electrode LE may be greater than a thickness of the upper electrode UE. However, embodiments are not limited thereto, and the thickness of the lower electrode LE may be substantially less than or equal to the thickness of the upper electrode UE.

The dielectric layer 160 may include a high-k dielectric layer. As used herein, the term "high-k dielectric layer" refers to a dielectric layer having a higher dielectric constant than a silicon oxide film. In embodiments, the dielectric layer 160 may include a metal oxide, such as hafnium (Hf), zirconium (Zr), aluminum (Al), niobium (Nb), cerium (Ce), lanthanum (La), tantalum (Ta), germanium (Ge), and/or titanium (Ti). In embodiments, the dielectric layer 160 may have a single layer structure including one high-k dielectric layer. In other embodiments, the dielectric layer 160 may have a multilayered structure including a plurality of high-k dielectric layers. The high-k dielectric layer may include $HfO_2$, $ZrO_2$, $Al_2O_3$, $La_2O_3$, $Ta_2O_3$, $Nb_2O_5$, $CeO_2$, $TiO_2$, $GeO_2$, or a combination thereof, without being limited thereto.

In embodiments, the dielectric layer 160 may include a ferroelectric material layer, an anti-ferroelectric material layer, and a paraelectric material layer. For example, the dielectric layer 160 may include $HfZrO_2$, $ZrO_2$, $PbTiO_3$, $AgNbO_3$, $HfO_2$, $ZrO_2$, $TiO_2$, $Ta_2O_3$, $VO_2$, $AlO_2$, $SiO_2$, $SrTiO_3$ $BaTiO_3$, $BiFeO_3$, or a combination thereof, without being limited thereto.

In embodiments, the dielectric layer 160 may include a multilayered structure in which a plurality of material layers including different materials are stacked. For example, the dielectric layer 160 may include a first dielectric layer 161 in contact with the lower electrode LE and a second dielectric layer 162 in contact with the first low-bandgap interfacial layer 170.

The first dielectric layer 161 may include a ferroelectric material layer, an anti-ferroelectric material layer, or a combination thereof. In embodiments, the first dielectric layer 161 may include a single layer in which a ferroelectric material is non-uniformly combined with an anti-ferroelectric material. In other embodiments, the first dielectric layer 161 may include a single layer including a ferroelectric material. In still other embodiments, the first dielectric layer 161 may include a single layer including an anti-ferroelectric material. The second dielectric layer 162 may include a paraelectric material layer.

In embodiments, the first dielectric layer 161 may include $HfZrO_2$, $ZrO_2$, $PbTiO_3$, $AgNbO_3$, or a combination thereof. The second dielectric layer 162 may include $HfO_2$, $ZrO_2$, $TiO_2$, $Ta_2O_3$, $VO_2$, $AlO_2$, $SiO_2$, $SrTiO_3$ $BaTiO_3$, $BiFeO_3$, or a combination thereof.

In embodiments, a thickness of the dielectric layer 160 may be greater than about 0 Å and less than or equal to about 60 Å. In some embodiments, a thickness of each of the first dielectric layer 161 and the second dielectric layer 162 may be greater than about 0 Å and less than about 30 Å. In other embodiments, a thickness of the first dielectric layer 161 or the second dielectric layer 162 may be in a range of about 30 Å to 60 Å, without being limited thereto.

Referring to FIG. 3A, the capacitor CP1 may include the first low-bandgap interfacial layer 170 between the upper electrode UE and the dielectric layer 160 and may not include the second low-bandgap interfacial layer 180 between the lower electrode LE and the dielectric layer 160. In embodiments, the first low-bandgap interfacial layer 170 may include a metal oxide. Specifically, the first low-bandgap interfacial layer 170 may include a metal oxide having a bandgap energy of more than about 2.5 eV and about 3.5 eV or less. For example, the first low-bandgap interfacial layer 170 may include cobalt oxide, tungsten oxide, vanadium oxide, copper oxide, titanium oxide, niobium oxide, iron oxide or a combination thereof. Alternatively, in some embodiments, the first low-bandgap interfacial layer 170 may include a metal oxide having a lower bandgap energy than $TiO_2$. That is, the first low-bandgap interfacial layer 170 may include a metal oxide having a bandgap energy of less than about 3.2 eV. In embodiments, the first low-bandgap interfacial layer 170 may be formed by using a single layer or a multilayered structure, which includes the metal oxide.

Because the semiconductor device 10 according to embodiments includes the first low-bandgap interfacial layer 170 between the upper electrode UE and the dielectric layer 160, the capacitor CP1 having improved dielectric and electric properties, and the semiconductor device 10 including the capacitor CP1 with improved dielectric and electric properties may be provided.

When the first low-bandgap interfacial layer 170, including a metal oxide with a low bandgap, is inserted between the dielectric layer 160 and the upper electrode UE, oxygen atoms forming the metal oxide in the first low-bandgap interfacial layer 170 may relatively easily break bonds with a metal element and diffuse into the dielectric layer 160. When oxygen diffuses into the dielectric layer 160, oxygen vacancy in the dielectric layer 160 may be passivated. As a result, band bending at an interface between the dielectric layer 160 and the upper electrode UE may be reduced, and a built-in potential therebetween may be reduced. When band bending occurs, a built-in potential may increase at the interface, for example, at the interface between the dielectric layer 160 and the upper electrode UE, thus causing the deterioration of dielectric properties. Therefore, the dielectric properties of the capacitors may be improved by reducing the built-in potential. That is, according to embodiments, by inserting an interfacial layer (i.e., the first low-bandgap interfacial layer 170 including a metal oxide) serving as a sacrificial film configured to supply oxygen atoms to the dielectric layer 160 between the dielectric layer 160 and the upper electrode UE, a built-in potential may be controlled, and dielectric properties of the dielectric layer 160 may be adjusted.

In addition, in embodiments, asymmetry in built-in potential at an interface between upper and lower portions of the dielectric layer 160, which occur due to a difference in thickness between the upper electrode UE and the lower electrode LE or a difference in work function between metals included therein, may be resolved. As described above, because the first low-bandgap interfacial layer 170 including a metal oxide having a low bandgap energy has an effect of lowering a built-in potential, symmetry of dielectric properties may be ensured by adjusting a thickness of the first low-bandgap interfacial layer 170 considering a degree of asymmetry in the built-in potential at the interface between the upper and lower portions of the dielectric layer 160.

Referring to FIG. 3B, the capacitor CP1 may include the first low-bandgap interfacial layer 170 between the upper electrode UE and the dielectric layer 160 and may not include the second low-bandgap interfacial layer 180 between the lower electrode LE and the dielectric layer 160. The first low-bandgap interfacial layer 170 may include a first low-bandgap interfacial region 171 and a first metal oxide 172 in the first low-bandgap interfacial region 171. The first metal oxide 172 may be obtained by oxidizing a first metal dopant (refer to 170*d* in FIG. 9A).

In embodiments, the first low-bandgap interfacial layer 170 may include the first low-bandgap interfacial region 171. The first low-bandgap interfacial region 171 may be formed between the upper electrode UE and the dielectric layer 160 and be a region in which the first low-bandgap interfacial layer 170 is formed. The first low-bandgap interfacial region 171 may include a thin electrode layer. The first low-bandgap interfacial region 171 may be an electrode layer having a smaller thickness than the lower electrode LE and the upper electrode UE. A thickness of the first low-bandgap interfacial region 171 may be greater than 0 Å and less than or equal to about 10 Å. The first low-bandgap interfacial region 171 may include a metal film, a conductive metal oxide film, a conductive metal nitride film, a conductive metal oxynitride film, or a combination thereof. In embodiments, the first low-bandgap interfacial region 171 may include Ti, Ti oxide, Ti nitride, Ti oxynitride, Nb, Nb oxide, Nb nitride, Nb oxynitride, Co, Co oxide, Co nitride, Co oxynitride, Sn, Sn oxide, Sn nitride, Sn oxynitride, or a combination thereof. For example, the first low-bandgap interfacial region 171 may include NbN, TiN, CoN, $SnO_2$, or a combination thereof. In other embodiments, the first low-bandgap interfacial region 171 may include TaN, TiAlN, TaAlN, W, Ru, $RuO_2$, $SrRuO_3$, Ir, $IrO_2$, Pt, PtO, SRO, BSRO, CRO, LSCO, or a combination thereof. However, a constituent material of the first low-bandgap interfacial region 171 is not limited thereto.

In embodiments, the first low-bandgap interfacial layer 170 may include the first metal dopant 170*d*, which is in an oxidized state in the form of the first metal oxide 172. Specifically, the first low-bandgap interfacial layer 170 may include the first metal dopant 170*d*, which is in the form of a metal having a bandgap energy of more than about 2.5 eV and less than or equal to about 3.5 eV. For example, the first low-bandgap interfacial layer 170 may include the first metal dopant 170*d*, which is present in the form of cobalt oxide, tungsten oxide, vanadium oxide, copper oxide, titanium oxide, niobium oxide, iron oxide, or a combination thereof. That is, the first metal dopant 170*d* may include cobalt (Co), tungsten (W), vanadium (V), copper (Cu), titanium (Ti), niobium (Nb), iron (Fe), or a combination thereof. In some embodiments, the first low-bandgap interfacial layer 170 may include the first metal dopant 170*d*, which is in the form of a metal oxide having a lower bandgap energy than $TiO_2$. That is, the first low-bandgap interfacial layer 170 may include the first metal dopant 170*d*, which is in the form of a metal oxide having a lower bandgap energy than about 3.2 eV.

Figure 4A:
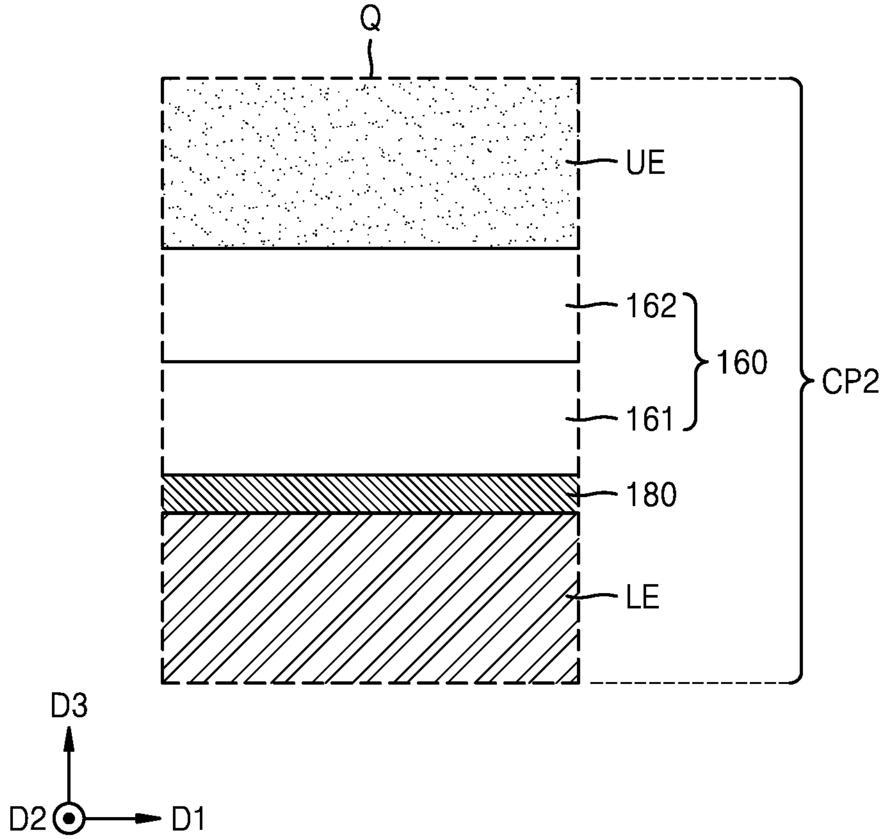
FIG. 4A is an enlarged cross-sectional view of region Q of FIG. 2B.
Figure 4B:
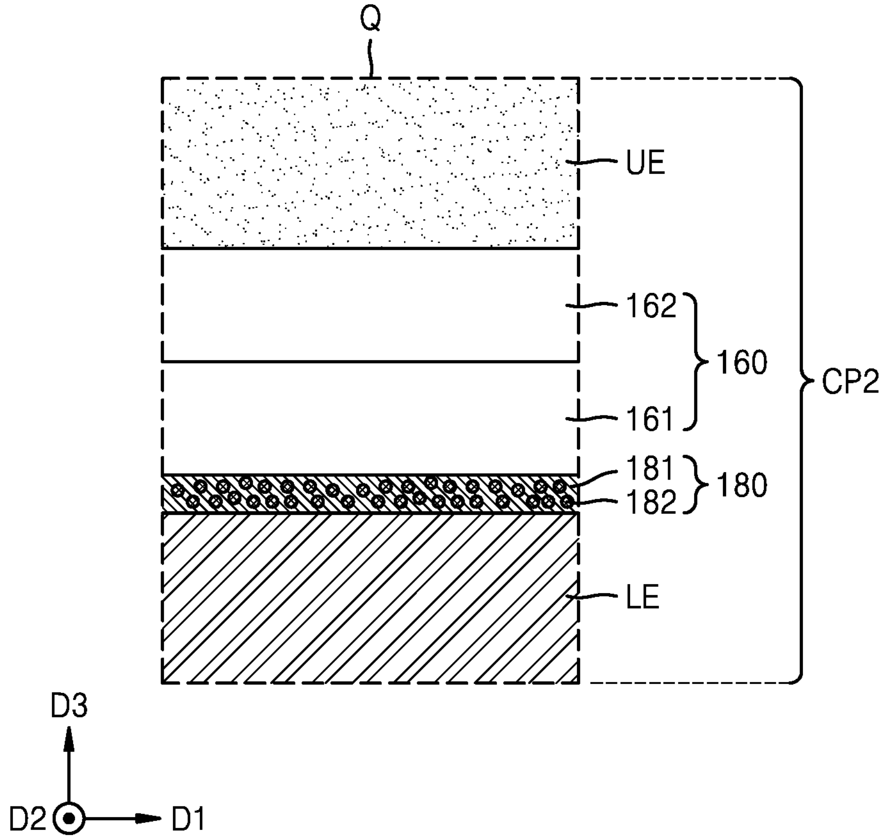
FIG. 4B is an enlarged cross-sectional view of another example structure of region Q.

FIG. 4A is an enlarged cross-sectional view of region Q of FIG. 2B, and FIG. 4B is another example structure of region Q. FIGS. 4A and 4B are each an enlarged cross-sectional view of region Q of FIG. 2B, according to embodiments, when a low-bandgap interfacial layer of the semiconductor device 10 according to embodiments does not include a first low-bandgap interfacial layer 170 between an upper electrode UE and a dielectric layer 160 but includes a second low-bandgap interfacial layer 180 between a lower electrode LE and the dielectric layer 160.

Referring to FIGS. 4A and 4B, a capacitor CP2 may include the lower electrode LE, the dielectric layer 160 on (e.g., covering) the lower electrode LE, the second low-bandgap interfacial layer 180 between the lower electrode LE and the dielectric layer 160, and the upper electrode UE on (e.g., covering) the dielectric layer 160. The upper electrode UE may be apart from the lower electrode LE with the second low-bandgap interfacial layer 180 and the dielectric layer 160 therebetween. That is, in an embodiment, the capacitor CP2 of which a portion is illustrated in FIGS. 4A and 4B according to the inventive concept may include the second low-bandgap interfacial layer 180 between the lower electrode LE and the dielectric layer 160.

Descriptions of the lower electrode LE, the dielectric layer 160, and the upper electrode UE may be similar to those provided with reference to FIGS. 3A and 3B. Hereinafter, configurations different from those of FIGS. 3A and 3B are mainly described.

Referring to FIG. 4A, the capacitor CP2 may not include the first low-bandgap interfacial layer 170 between the upper electrode UE and the dielectric layer 160 and may include the second low-bandgap interfacial layer 180 between the lower electrode LE and the dielectric layer 160. In embodiments, the second low-bandgap interfacial layer 180 may include a metal oxide. Specifically, the second low-bandgap interfacial layer 180 may include a metal oxide having a bandgap energy of more than about 2.5 eV and less than or equal to about 3.5 eV. For example, the second low-bandgap interfacial layer 180 may include cobalt oxide, tungsten oxide, vanadium oxide, copper oxide, titanium oxide, niobium oxide, iron oxide, or a combination thereof. Alternatively, in some embodiments, the second low-bandgap interfacial layer 180 may include a metal oxide having a lower bandgap energy than $TiO_2$. That is, the second low-bandgap interfacial layer 180 may include a metal oxide having a bandgap energy lower than about 3.2 eV. In embodiments, the second low-bandgap interfacial layer 180 may include a single layer or a multilayered structure including the metal oxide.

Because the semiconductor device 10 according to the embodiments includes the second low-bandgap interfacial layer 180 between the lower electrode LE and the dielectric layer 160, the capacitor CP2 having improved dielectric and electric properties and the semiconductor device 10 including the capacitor CP2 with improved dielectric and electric properties may be provided.

Referring to FIG. 4B, the capacitor CP2 may not include the first low-bandgap interfacial layer 170 between the upper electrode UE and the dielectric layer 160 and may include the second low-bandgap interfacial layer 180 between the lower electrode LE and the dielectric layer 160. The second low-bandgap interfacial layer 180 may include a second low-bandgap interfacial region 181 and a second metal oxide 182 in the second low-bandgap interfacial region 181. The second metal oxide 182 may be obtained by oxidizing a second metal dopant (refer to 180*d* in FIG. 11A).

In embodiments, the second low-bandgap interfacial layer 180 may include the second low-bandgap interfacial region 181. In some embodiments, the second low-bandgap interfacial region 181 may be formed between the lower electrode LE and the dielectric layer 160 and be a region in which the second low-bandgap interfacial layer 180 is formed. The second low-bandgap interfacial region 181 may be a thin electrode layer. The second low-bandgap interfacial region 181 may be an electrode layer having a smaller thickness than the lower electrode LE and the upper electrode UE. A thickness of the second low-bandgap interfacial region 181 may be greater than about 0 Å and less than or equal to 10 Å. The second low-bandgap interfacial region 181 may include a metal film, a conductive metal oxide film, a conductive metal nitride film, a conductive metal oxynitride film, or a combination thereof. However, a constituent material of the second low-bandgap interfacial region 181 is not limited to the examples described above. In other embodiments, the second low-bandgap interfacial region 181 may be a partial region of the lower electrode LE. Specifically, the second low-bandgap interfacial region 181 may be a partial region of the lower electrode LE, which is in contact with the dielectric layer 160. In this case, the second low-bandgap interfacial layer 180 may be formed by doping the second metal dopant 180*d* into the partial region of the lower electrode LE.

In embodiments, the second low-bandgap interfacial layer 180 may include the second metal dopant 180*d*, which is in an oxidized state in the form of the second metal oxide 182. Specifically, the second low-bandgap interfacial layer 180 may include the second metal dopant 180*d*, which is in the form of a metal oxide having a bandgap energy of more than about 2.5 eV and less than or equal to about 3.5 eV. For example, the second low-bandgap interfacial layer 180 may include the second metal dopant 180*d*, which includes cobalt oxide, tungsten oxide, vanadium oxide, copper oxide, titanium oxide, niobium oxide, iron oxide, or a combination thereof. That is, the second metal dopant 180*d* may include cobalt (Co), tungsten (W), vanadium (V), copper (Cu), titanium (Ti), niobium (Nb), iron (Fe), or a combination thereof. Alternatively, in some embodiments, the second low-bandgap interfacial layer 180 may include the second metal dopant 180*d*, which is in the form of a metal oxide having a lower bandgap energy than $TiO_2$. That is, the second low-bandgap interfacial layer 180 may include the second metal dopant 180*d*, which is in the form of a metal oxide having a lower bandgap energy than about 3.2 eV.

Figure 5A:
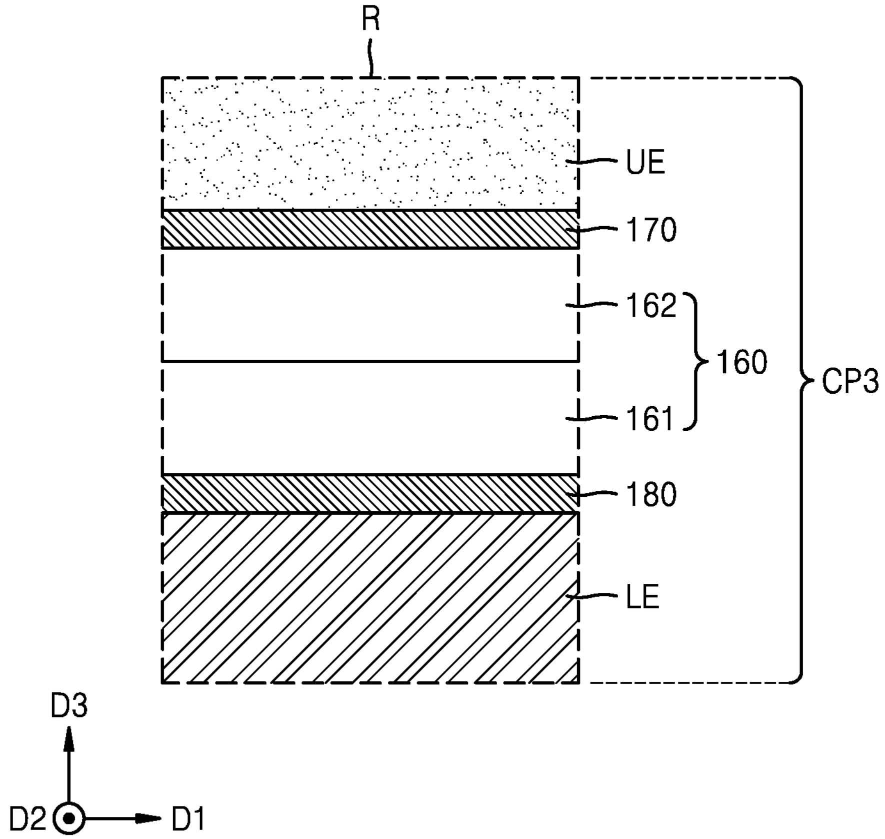
FIG. 5A is an enlarged cross-sectional view of region R of FIG. 2C.

FIG. 5A is an enlarged cross-sectional view of region R of FIG. 2C, and FIGS. 5B to 5D are other example structures of region R. FIGS. 5A to 5D are enlarged cross-sectional views of region R of FIG. 2C, according to embodiments, when a low-bandgap interfacial layer of the semiconductor device 10 according to embodiments includes a first low-bandgap interfacial layer 170 between an upper electrode UE and a dielectric layer 160 and includes a second low-bandgap interfacial layer 180 between a lower electrode LE and the dielectric layer 160.

Referring to FIGS. 5A to 5D, a capacitor CP3 may include the lower electrode LE, the dielectric layer 160 on (e.g., covering) the lower electrode LE, the second low-bandgap interfacial layer 180 formed between the lower electrode LE and the dielectric layer 160, the first low-bandgap interfacial layer 170 formed on the dielectric layer 160, and the upper electrode UE on (e.g., covering) the first low-bandgap interfacial layer 170. The upper electrode UE may be apart from the lower electrode LE. That is, in an embodiment, the capacitor CP3 of which a portion is illustrated in each of FIGS. 5A to 5D according to the inventive concept may include the first low-bandgap interfacial layer 170 between the upper electrode UE and the dielectric layer 160 and include the second low-bandgap interfacial layer 180 between the lower electrode LE and the dielectric layer 160.

Descriptions of the lower electrode LE, the dielectric layer 160, and the upper electrode UE may be similar to those provided with reference to FIGS. 3A and 3B. Hereinafter, configurations different from those of FIGS. 3A and 3B are mainly described.

Referring to FIG. 5A, the capacitor CP3 may include the first low-bandgap interfacial layer 170 between the upper electrode UE and the dielectric layer 160 and include the second low-bandgap interfacial layer 180 between the lower electrode LE and the dielectric layer 160. In embodiments, the first low-bandgap interfacial layer 170 and the second low-bandgap interfacial layer 180 may include a metal oxide. Specifically, each of the first low-bandgap interfacial layer 170 and the second low-bandgap interfacial layer 180 may include a metal oxide having a bandgap energy of more than about 2.5 eV and about 3.5 eV or less. In embodiments, the second low-bandgap interfacial layer 180 may include a different metal oxide from the first low-bandgap interfacial layer 170. In other embodiments, the second low-bandgap interfacial layer 180 may include the same metal oxide as the first low-bandgap interfacial layer 170.

Figure 5B:
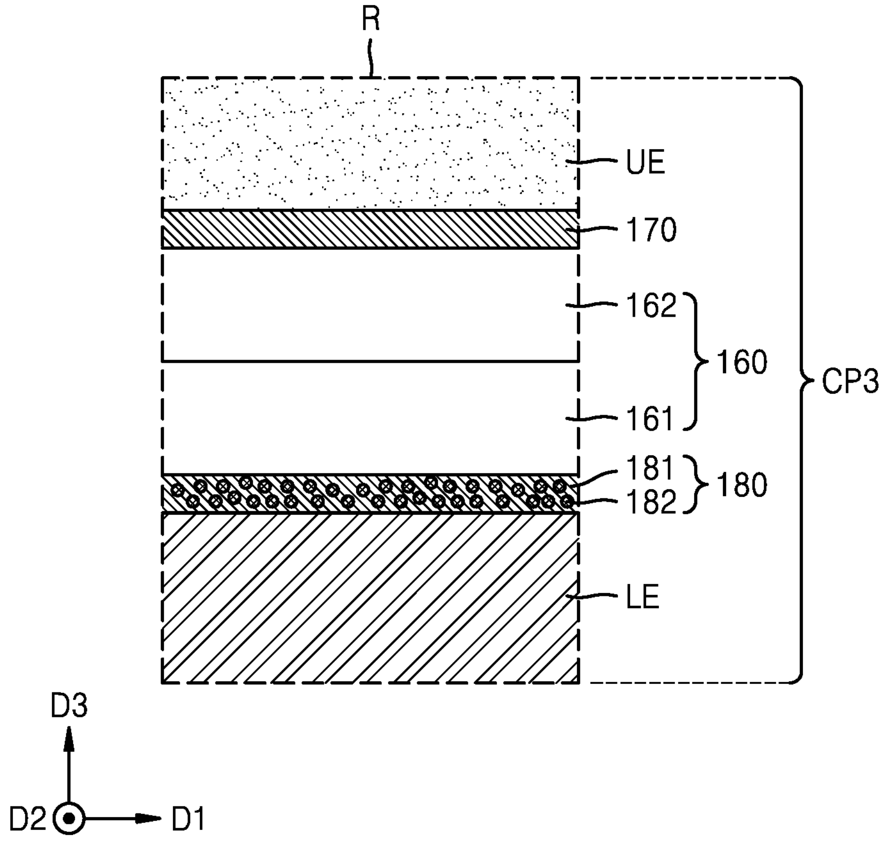
FIGS. 5B to 5D are enlarged cross-sectional views of other example structures of region R.

Referring to FIG. 5B, the capacitor CP3 may include the first low-bandgap interfacial layer 170 between the upper electrode UE and the dielectric layer 160 and include the second low-bandgap interfacial layer 180 between the lower electrode LE and the dielectric layer 160. The second low-bandgap interfacial layer 180 may include a second low-bandgap interfacial region 181 and a second metal dopant 180*d*, which is in an oxidized state in the form of a second metal oxide 182 in the second low-bandgap interfacial region 181. Specifically, the second low-bandgap interfacial layer 180 may include the second metal dopant 180*d*, which is in the form of a metal oxide having a bandgap energy of more than about 2.5 eV and less than or equal to about 3.5 eV.

Figure 5C:
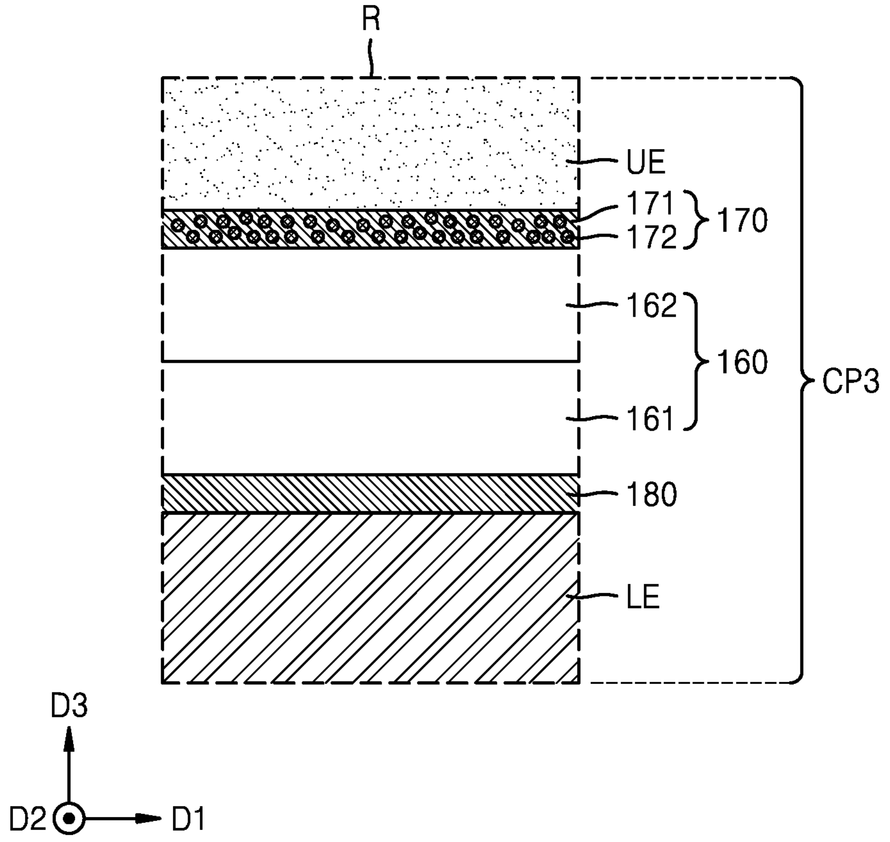

Referring to FIG. 5C, the capacitor CP3 may include the first low-bandgap interfacial layer 170 between the upper electrode UE and the dielectric layer 160 and include the second low-bandgap interfacial layer 180 between the lower electrode LE and the dielectric layer 160. The first low-bandgap interfacial layer 170 may include a first low-bandgap interfacial region 171 and a first metal dopant 170*d*, which is in an oxidized state in the form of a first metal oxide 172 in the first low-bandgap interfacial region 171. Specifically, the first low-bandgap interfacial layer 170 may include the first low-bandgap interfacial region 171 and the first metal dopant 170*d*, which is in the form of a metal oxide having a bandgap energy of more than 2.5 eV and less than or equal to about 3.5 eV.

Figure 5D:
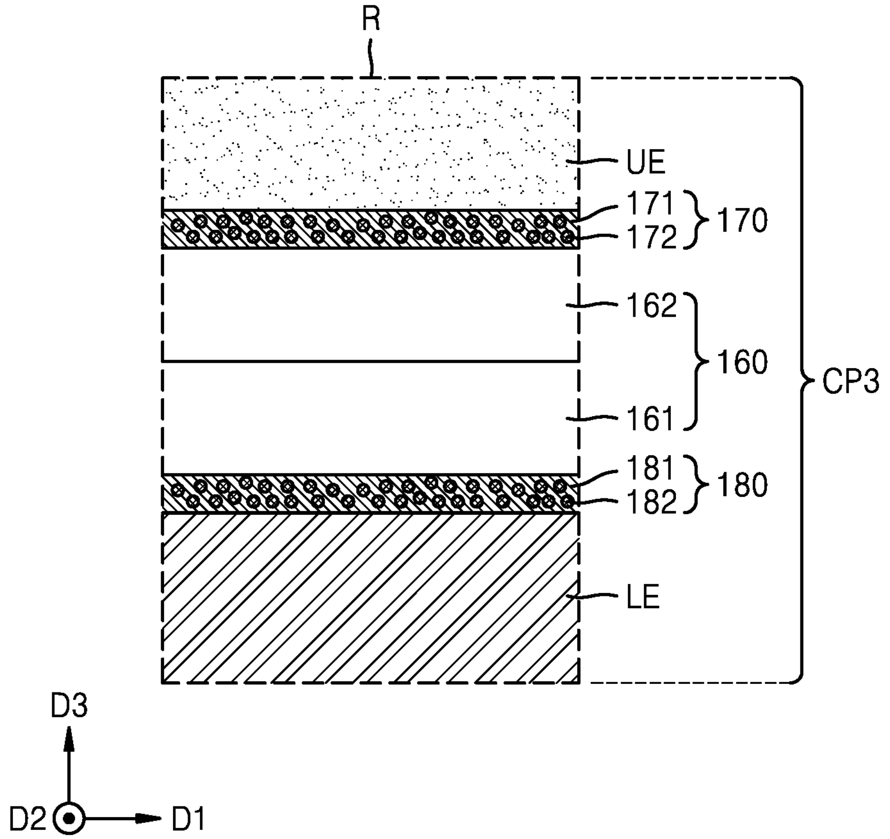

Referring to FIG. 5D, the capacitor CP3 may include the first low-bandgap interfacial layer 170 between the upper electrode UE and the dielectric layer 160 and include the second low-bandgap interfacial layer 180 between the lower electrode LE and the dielectric layer 160. The first low-bandgap interfacial layer 170 may include a first low-bandgap interfacial region 171 and a first metal dopant 170*d*, which is in an oxidized state in the form of a first metal oxide 172 in the first low-bandgap interfacial region 171. The second low-bandgap interfacial layer 180 may include a second low-bandgap interfacial region 181 and a second metal dopant 180*d*, which is in an oxidized state in the form of a second metal oxide 182 in the second low-bandgap interfacial region 181.

In embodiments, when the capacitor CP3 includes both first low-bandgap interfacial layer 170 and second low-bandgap interfacial layer 180 as shown in FIGS. 5A to 5D, a thickness of the first low-bandgap interfacial layer 170 may be different from a thickness of the second low-bandgap interfacial layer 180. For example, when a thickness of the lower electrode LE is greater than that of the upper electrode UE, the thickness of the first low-bandgap interfacial layer 170 may be greater than the thickness of the second low-bandgap interfacial layer 180. In embodiments, a content ratio of the metal oxide in the first low-bandgap interfacial layer 170 may be higher than a content ratio of the metal oxide in the second low-bandgap interfacial layer 180. A content ratio of the first metal dopant 170*d* may be higher than a content ratio of the second metal dopant 180*d*. The content ratio of each of the first metal dopant 170*d* and the second metal dopant 180*d* may be more than about 0 atomic percent (at %) and less than or equal to about 5 at %.

FIGS. 6A to 6H are cross-sectional views of a method of manufacturing the semiconductor device, according to the embodiments shown in FIG. 2A. In FIGS. 6A to 6H, the same reference numerals are used to denote the same elements as in FIGS. 1 to 5D, and repeated descriptions thereof will be omitted.

Figure 6A:
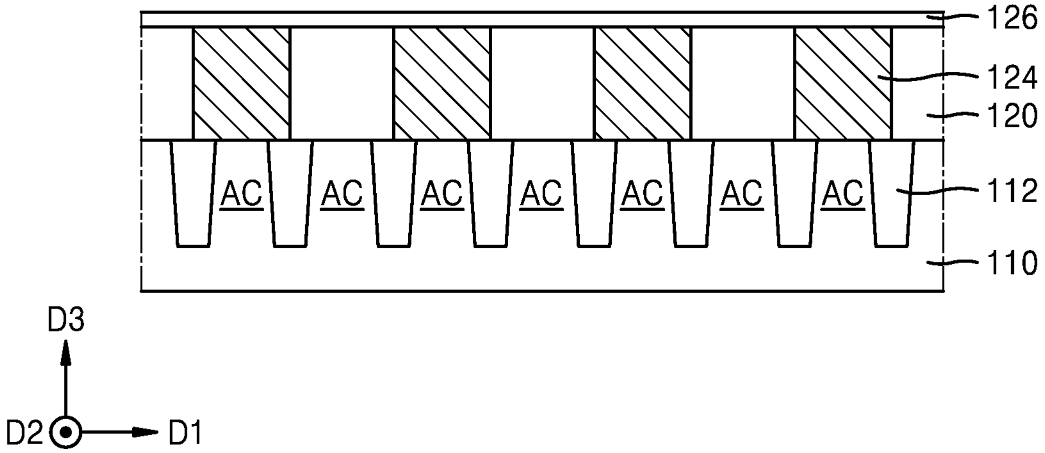
FIGS. 6A to 6H are cross-sectional views of a method of manufacturing the semiconductor device according to the embodiments shown in FIG. 2A.

Referring to FIG. 6A, a lower structure 120 and a conductive region 124 may be formed on a substrate 110 in which an active region AC is defined by a device isolation film 112. The conductive region 124 may pass through the lower structure 120 and be connected to the active region AC. Thereafter, an insulating film 126 may be formed on (e.g., to cover) the lower structure 120 and the conductive region 124.

The insulating film 126 may be used as an etch stop layer in a subsequent process. The insulating film 126 may include an insulating material having an etch selectivity with respect to the lower structure 120. In some embodiments, the insulating film 126 may include a silicon nitride (SiN) film, a silicon carbonitride (SiCN) film, a silicon boron nitride (SiBN) film, or a combination thereof.

Figure 6B:
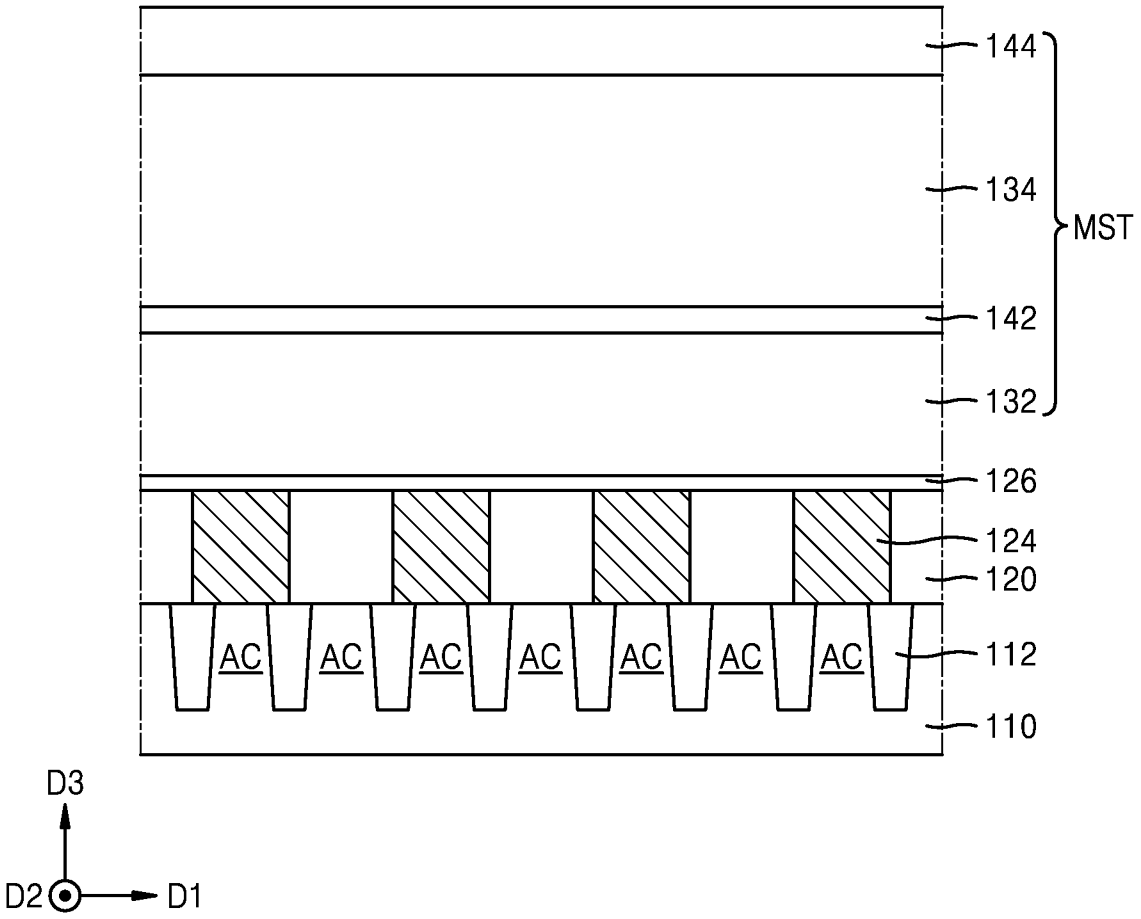

Referring to FIG. 6B, a mold structure MST may be formed on the insulating film 126. The mold structure MST may include a plurality of mold layers and a plurality of support films. For example, the mold structure MST may include a first mold film 132, a lower supporter film 142, a second mold film 134, and an upper supporter film 144, which are sequentially stacked on the insulating film 126. Each of the first mold film 132 and the second mold film 134 may include a material, which has a relatively high etch rate with respect to an etchant including ammonium fluoride ($NH_4F$), hydrofluoric acid (HF), and water, and may be removed by a lift-off process using the etchant. In some embodiments, each of the first mold film 132 and the second mold film 134 may include an oxide film, a nitride film, or a combination thereof. For example, the first mold film 132 may include a borophosphosilicate glass (BPSG) film. The BPSG film may include at least one of a first portion in which the concentration of a dopant B (boron) varies in a thickness direction of the BPSG film and a second portion in which the concentration of a dopant P (phosphorus) varies in the thickness direction of the BPSG film. The second mold film 134 may include a silicon nitride film or a multilayered insulating film in which a silicon oxide film and a silicon nitride film, each of which has a relatively small thickness, are alternately and repeatedly stacked one-by-one plural times. However, constituent materials of the first mold film 132 and the second mold film 134 are not limited to the examples described above and may be variously modified and changed within the scope of the inventive concept. In addition, the order of stacking of films in the mold structure MST is not limited to the example shown in FIG. 6B and may be variously modified and changed within the scope of the inventive concept.

Each of the lower supporter film 142 and the upper supporter film 144 may include a silicon nitride (SiN) film, a silicon carbonitride (SiCN) film, a silicon boron nitride (SiBN), or a combination thereof. In embodiments, the lower supporter film 142 and the upper supporter film 144 may include the same material as each other. In other embodiments, the lower supporter film 142 and the upper supporter film 144 may include different materials from each other. In an example, each of the lower supporter film 142 and the upper supporter film 144 may include a silicon carbonitride film. In another example, the lower supporter film 142 may include a silicon carbonitride film, and the upper supporter film 144 may include a boron (B)-containing silicon nitride film. However, constituent materials of the lower supporter film 142 and the upper supporter film 144 are not limited to the examples described above and may be variously modified and changed within the scope of the inventive concept.

Figure 6C:
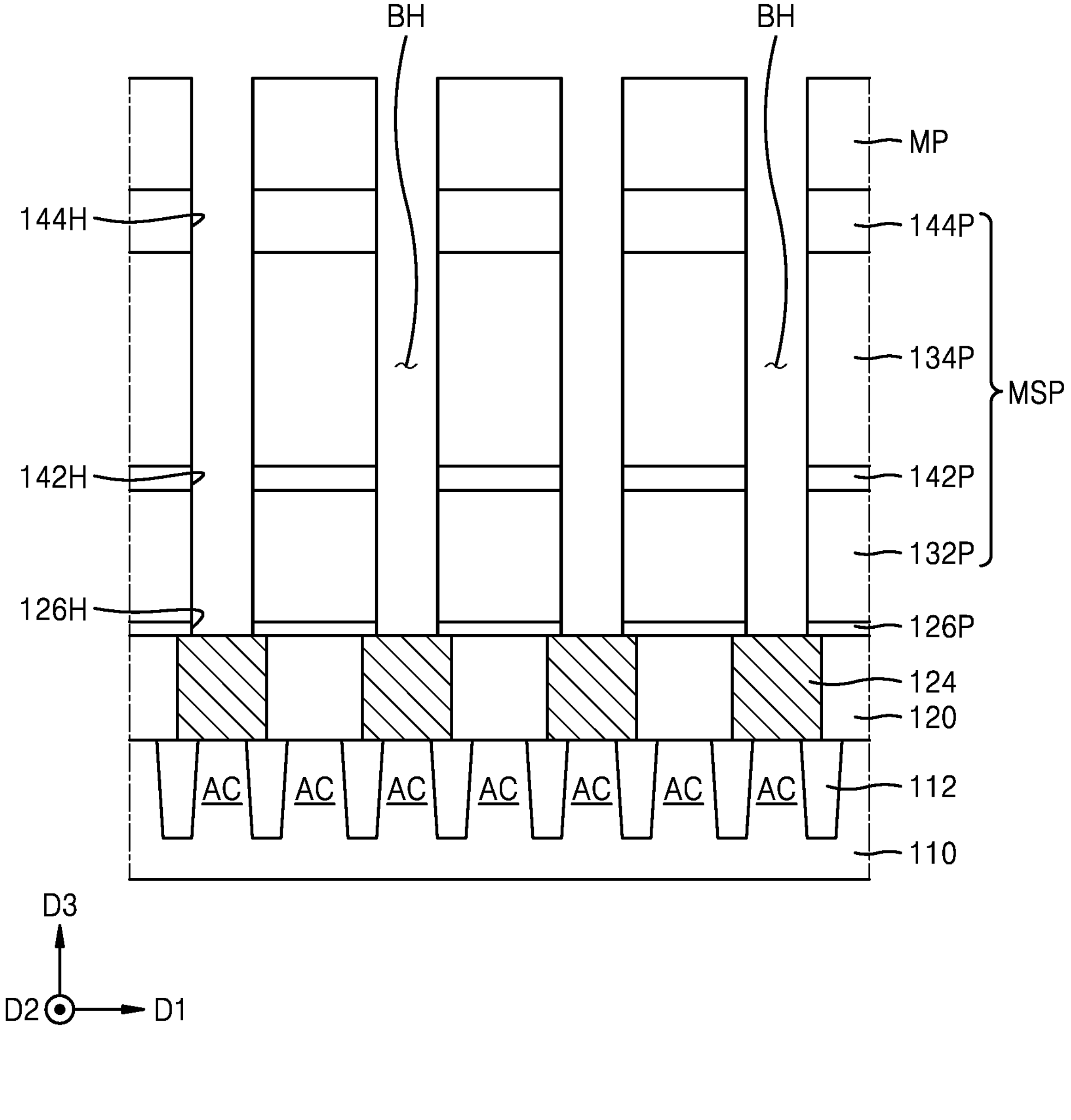

Referring to FIG. 6C, a mask pattern MP may be formed on the mold structure MST in the resultant structure of FIG. 6B. Thereafter, the mold structure MST may be anisotropically etched by using the mask pattern MP as an etch mask and using the insulating film 126 as an etch stop layer to form a mold structure pattern MSP defining a plurality of holes BH. The mold structure pattern MSP may include a first mold pattern 132P, a lower supporter 142P, a second mold pattern 134P, and an upper supporter 144P.

The mask pattern MP may include a nitride film, an oxide film, a polysilicon film, a photoresist film, or a combination thereof.

The process of forming the plurality of holes BH may further include wet processing the resultant structure obtained by anisotropically etching the mold structure MST. During the process of wet processing the resultant structure obtained by anisotropically etching the mold structure MST, portions of the insulating film 126 may be etched together, and thus, an insulating pattern 126P having a plurality of openings 126H exposing the plurality of conductive regions 124 may be obtained. An example process for wet processing the resultant structure obtained by anisotropically etching the mold structure MST may be performed using an etchant including a diluted sulfuric acid peroxide (DSP) solution, without being limited thereto.

In the mold structure pattern MSP, a plurality of holes 142H, which are portions of the plurality of holes BH, may be formed in the lower supporter 142P, and a plurality of holes 144H, which are portions of the plurality of holes BH, may be formed in the upper supporter 144P.

Figure 6D:
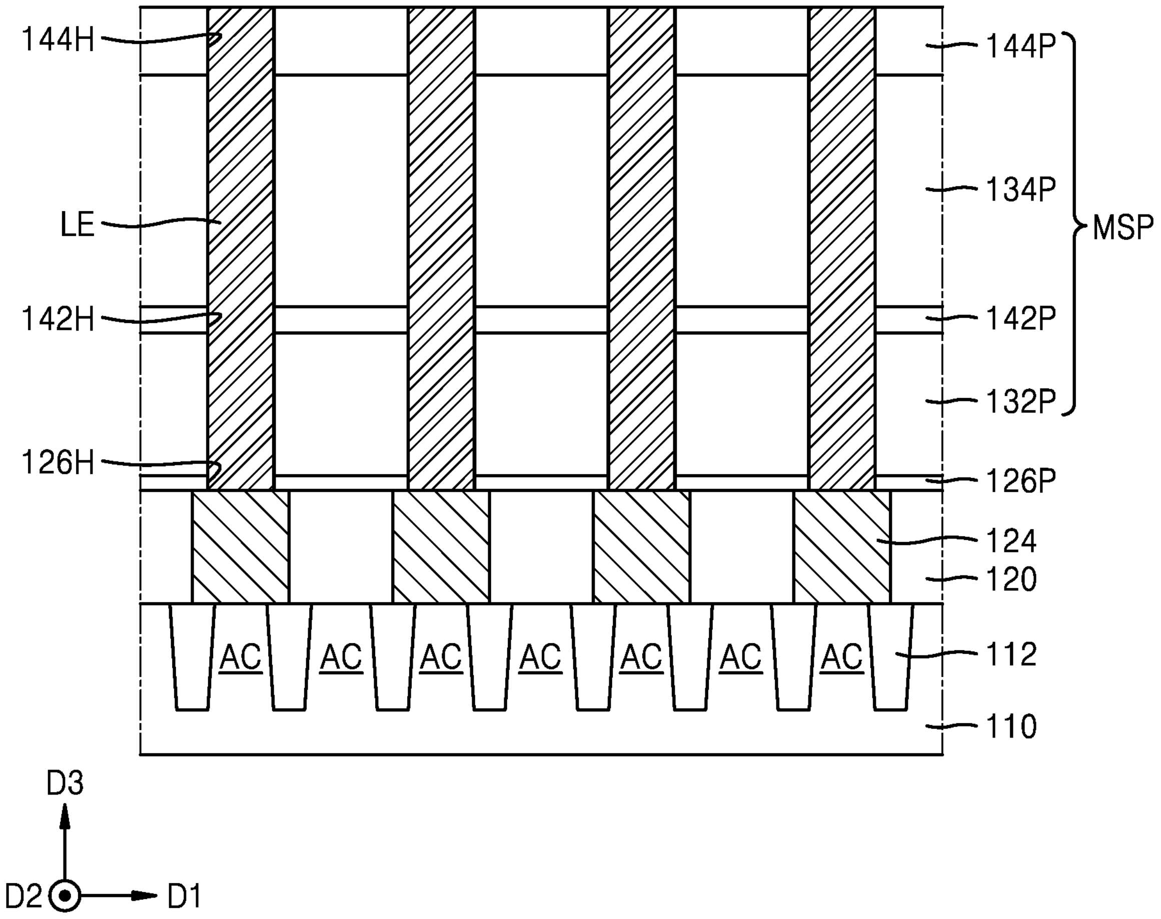

Referring to FIG. 6D, the mask pattern MP may be removed from the resultant structure of FIG. 6C, and a lower electrode LE may be formed to fill each of the plurality of holes BH.

In embodiments, to form the lower electrode LE, a conductive layer filling the plurality of holes BH and covering a top surface of the upper supporter 144P may be formed on the resultant structure of FIG. 6D. To form the conductive layer, a chemical vapor deposition (CVD) process, a plasma-enhanced CVD (PECVD) process, a metal organic CVD (MOCVD) process, or an atomic layer deposition (ALD) process may be used. Afterwards, a portion of the conductive layer may be removed by using an etch back process or a chemical mechanical polishing (CMP) process, and thus, the top surface of the upper supporter 144P may be exposed.

Figure 6E:
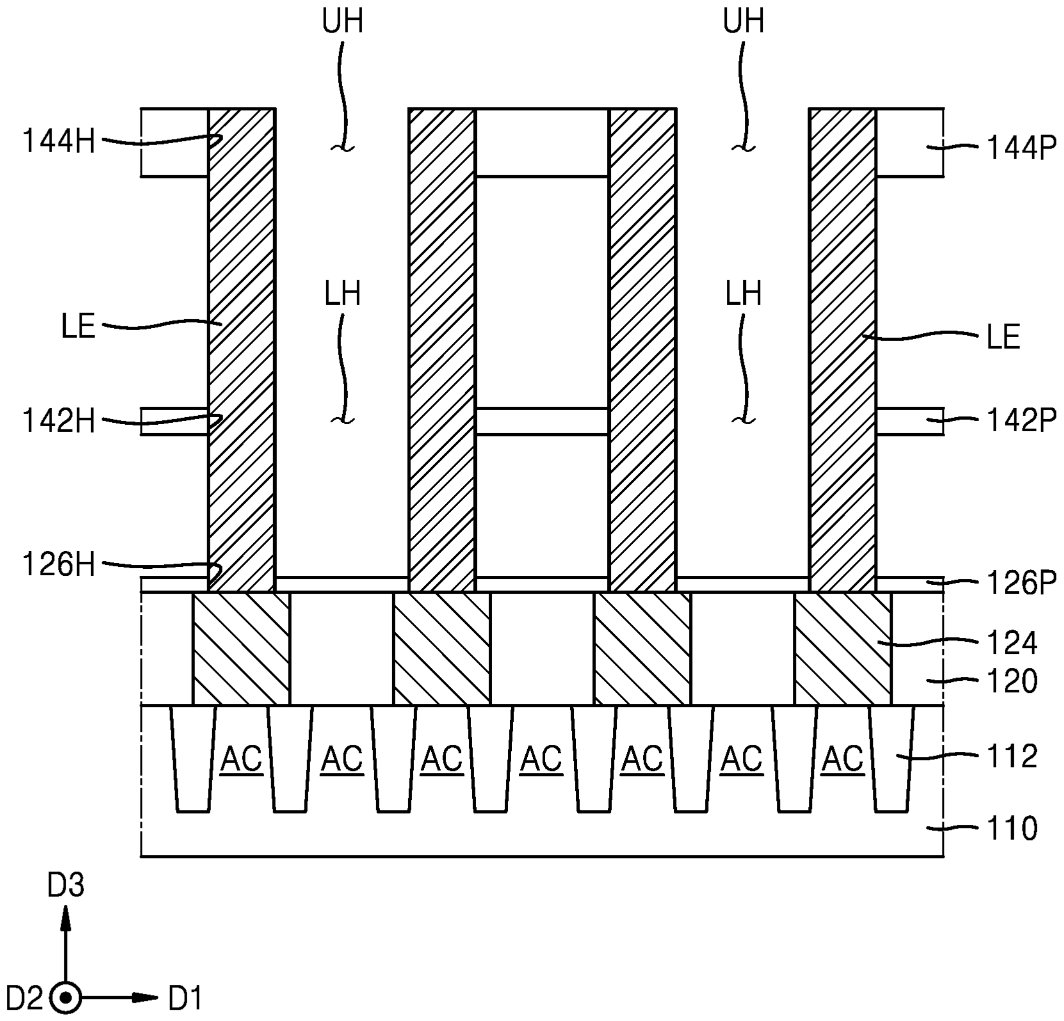

Referring to FIG. 6E, a plurality of upper holes UH may be formed by removing portions of the upper supporter 144P from the resultant structure of FIG. 6D. Thereafter, the second mold pattern 134P may be wet removed through the plurality of upper holes UH. Next, portions of the lower supporter 142P, which are exposed through the plurality of upper holes UH, may be removed to form a plurality of lower holes LH. Thereafter, the first mold pattern 132P may be wet removed through the plurality of lower holes LH to expose a top surface of the insulating pattern 126P. After the first mold pattern 132P and the second mold pattern 134P are removed, sidewalls and upper surfaces of a plurality of lower electrodes LE may be exposed.

In embodiments, the second mold pattern 134P and the first mold pattern 132P may be wet removed by using an etchant including ammonium fluoride ($NH_4F$), hydrofluoric acid (HF), and water, without being limited thereto.

Figure 6F:
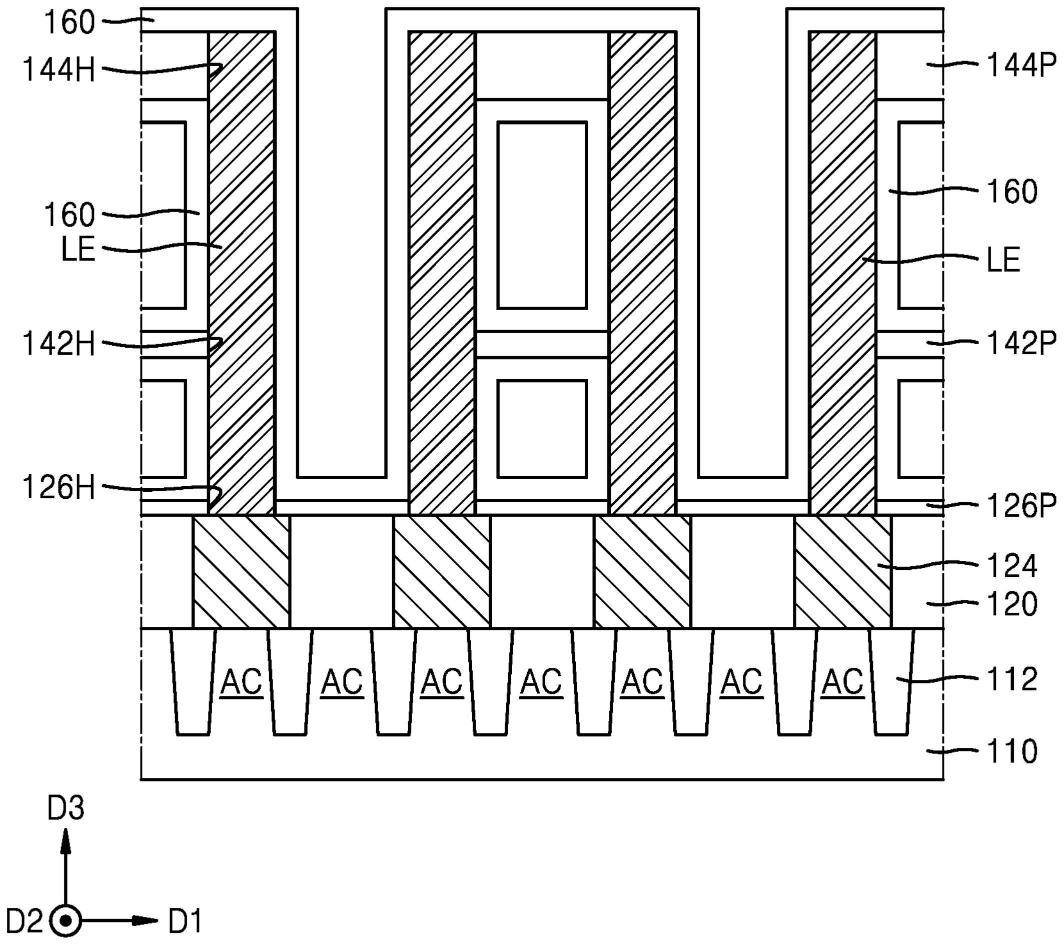

Referring to FIG. 6F, a dielectric layer 160 covering the lower electrodes LE, which are exposed, may be formed on the resultant structure of FIG. 6E. The dielectric layer 160 may be formed on (e.g., to cover) not only the sidewalls and upper surfaces of the lower electrodes LE but also the exposed surfaces of each of the lower supporter 142P and the upper supporter 144P and the exposed surfaces of the insulating pattern 126P. To form the dielectric layer 160, a CVD process, a PECVD process, an MOCVD process, or an ALD process may be used. After the dielectric layer 160 is deposited on (e.g., to cover) the lower electrodes LE, an annealing process may be performed on the resultant structure. In embodiments, the annealing process may be performed at a temperature of about 200° C. to about 700° C. The crystallinity of the dielectric layer 160 may be improved due to the annealing process that may be performed on the resultant structure including the dielectric layer 160.

Figure 6G:
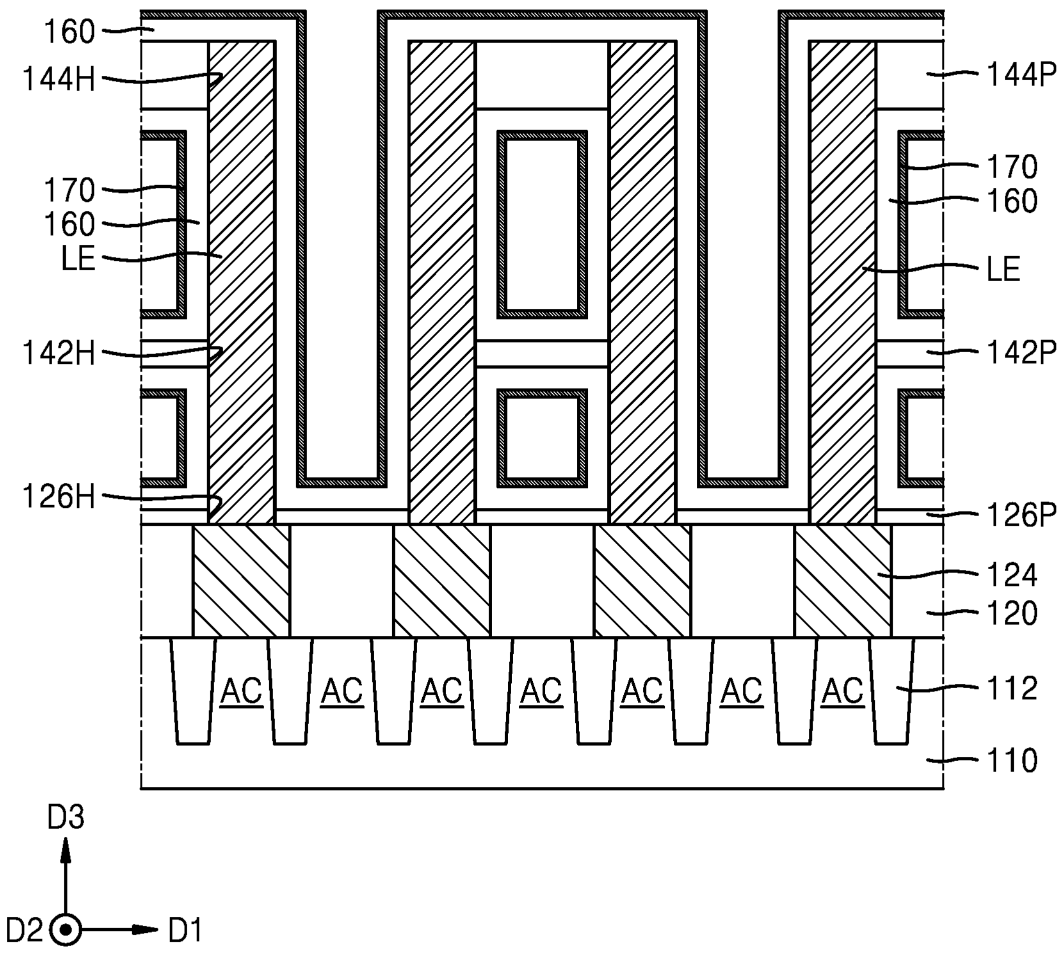

Referring to FIG. 6G, a first low-bandgap interfacial layer 170 covering the dielectric layer 160 may be formed on the resultant structure of FIG. 6E. To form the first low-bandgap interfacial layer 170, a CVD process, a PECVD process, an MOCVD process, or an ALD process may be used. In other embodiments, the annealing process may be performed on the resultant structure including the first low-bandgap interfacial layer 170.

Figure 6H:
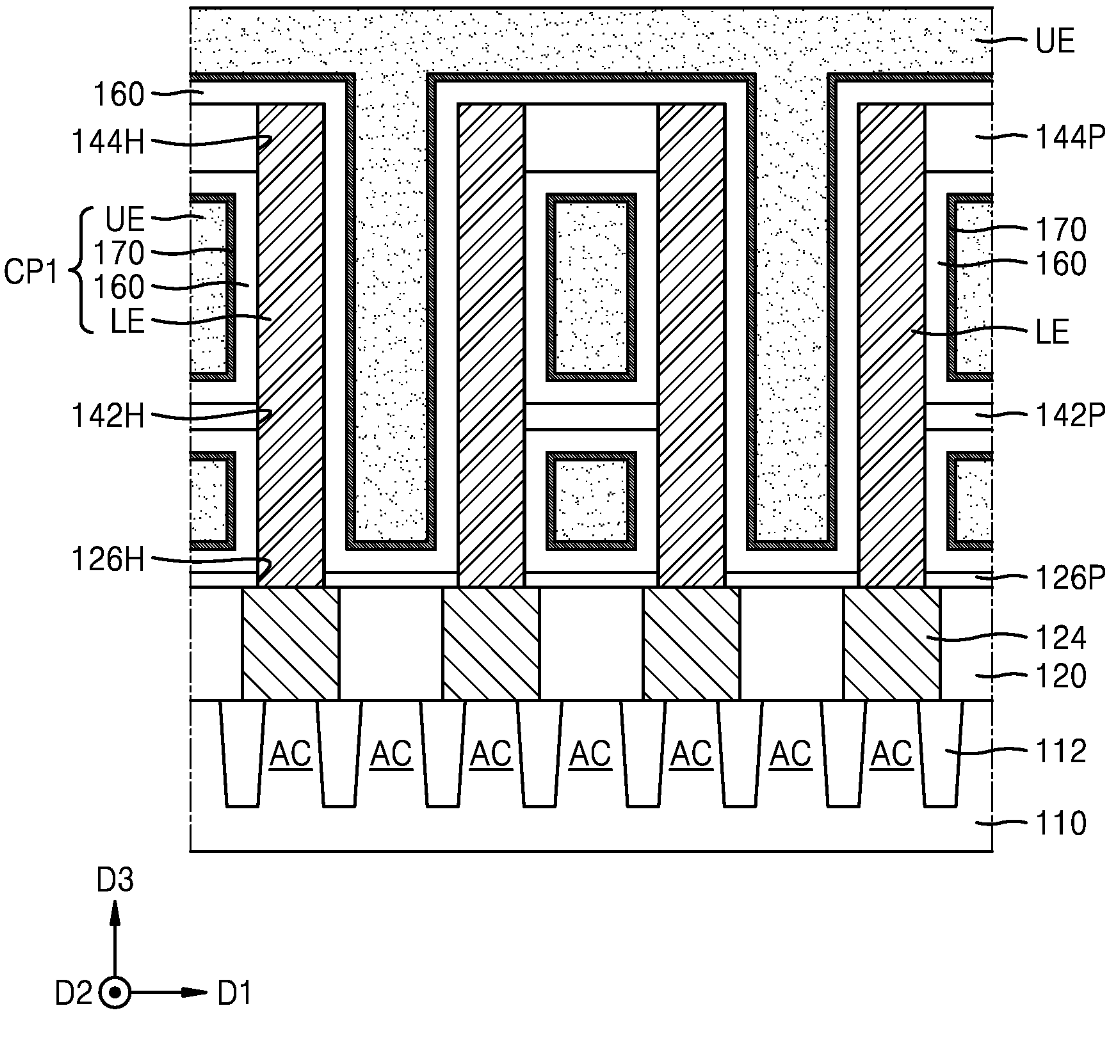

Referring to FIG. 6H, an upper electrode UE may be formed on the resultant structure of FIG. 6G, and thus, the semiconductor device 10 shown in FIG. 2A may be manufactured. In embodiments, to form the upper electrode UE, a CVD process, a MOCVD process, a PVD process, or an ALD process may be used.

Figure 7A:
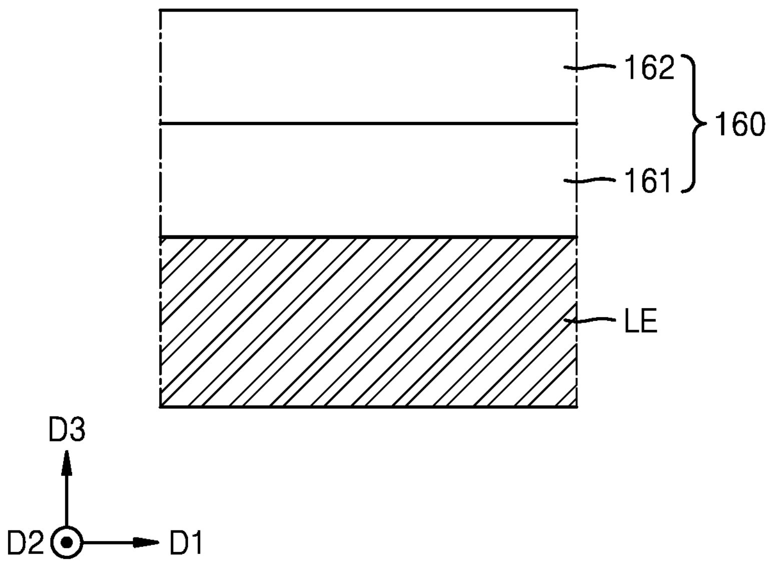
FIGS. 7A and 7B are cross-sectional views of some operations/processes of a method of manufacturing a semiconductor device, according to the embodiment shown in FIG. 3A.
Figure 7B:
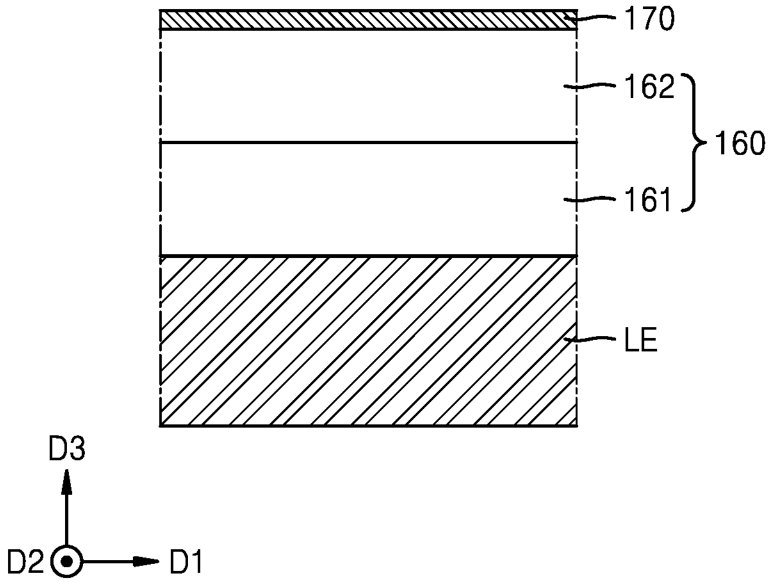
Figure 8A:
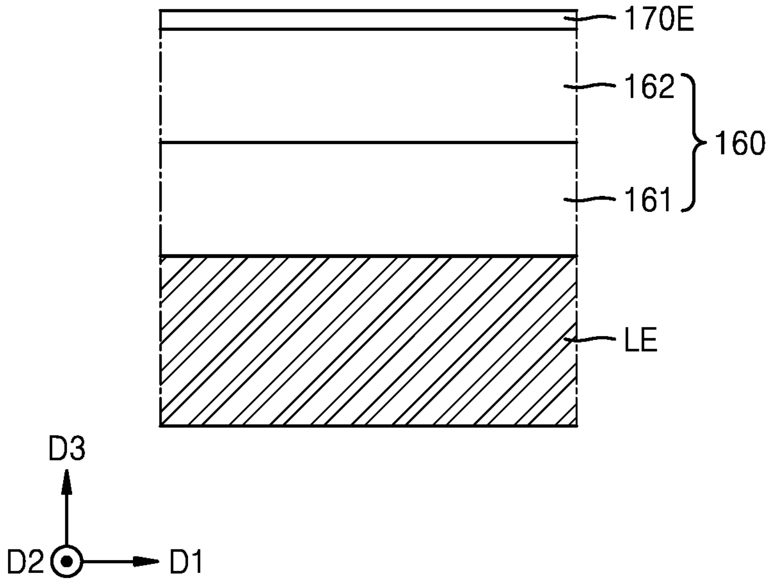
FIGS. 8A to 8C are cross-sectional views of some operations/processes of an example of a method of manufacturing a semiconductor device, according to the embodiment shown in FIG. 3B.
Figure 8B:
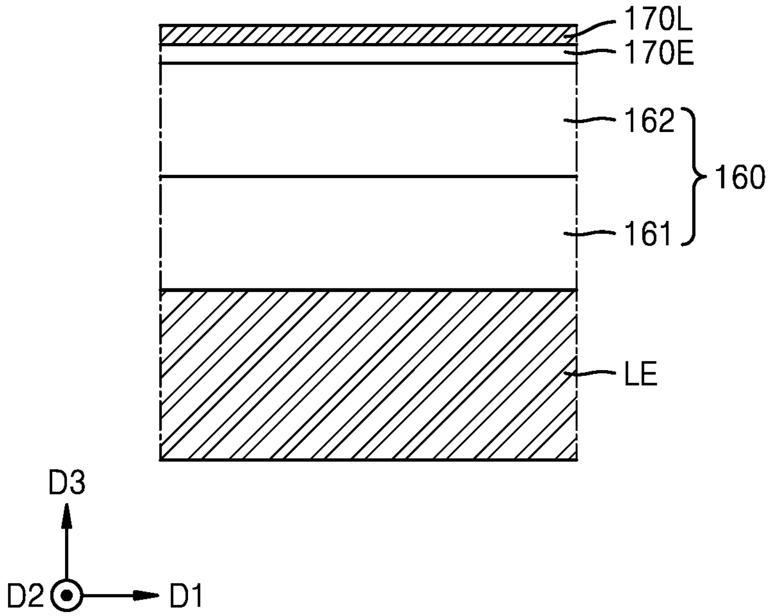
Figure 8C:
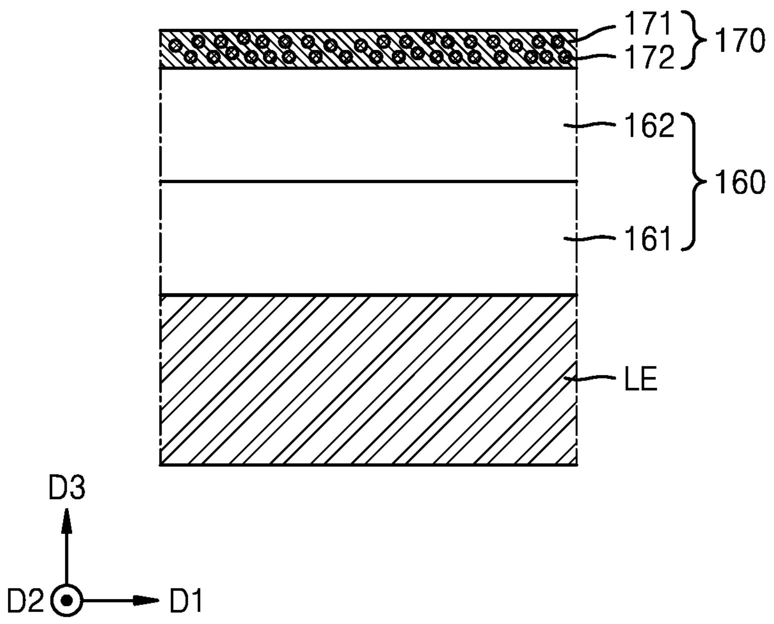
Figure 9A:
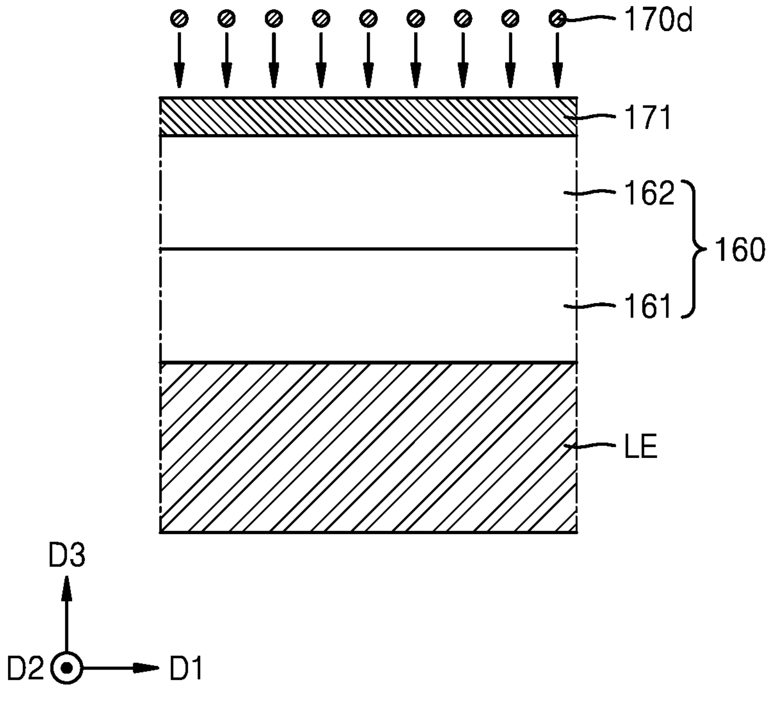
FIGS. 9A and 9B are cross-sectional views of some operations/processes of another example of the method of manufacturing the semiconductor device shown in FIG. 3B, according to the embodiment shown in FIG. 3B.
Figure 9B:
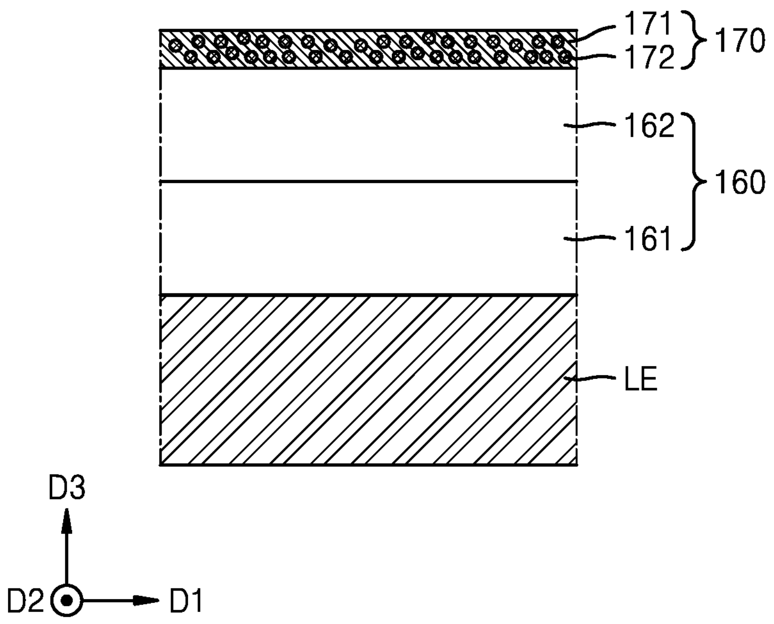

FIGS. 7A and 7B, 8A to 8C, and 9A and 9B are cross-sectional views of examples of the operation/process shown in FIG. 6G, of the method of manufacturing the semiconductor device 10 including the first low-bandgap interfacial layer 170, which has been described with reference to FIGS. 6A to 6H. Specifically, FIGS. 7A and 7B are cross-sectional views of some operations/processes of a method of manufacturing the semiconductor device 10, according to the embodiment shown in FIG. 3A. FIGS. 8A to 8C are cross-sectional views of some operations/processes of an example of the method of manufacturing the semiconductor device 10, according to the embodiment shown in FIG. 3B. FIGS. 9A and 9B are cross-sectional views of some operations/processes of another example of the method of manufacturing the semiconductor device 10, according to the embodiment shown in FIG. 3B.

Referring to FIGS. 7A and 7B, a first low-bandgap interfacial layer 170 may be formed on a dielectric layer 160. Specifically, the first low-bandgap interfacial layer 170 may be formed by depositing a metal oxide on the dielectric layer 160 by using a CVD process, an MOCVD process, a PVD process, or an ALD process. The metal oxide may include a metal oxide having a bandgap energy of more than about 2.5 eV and less than or equal to about 3.5 eV. For example, the metal oxide may include cobalt oxide, tungsten oxide, vanadium oxide, copper oxide, titanium oxide, niobium oxide, iron oxide, or a combination thereof. Alternatively, in some embodiments, the metal oxide may include a metal oxide having a lower bandgap energy than $TiO_2$.

Referring to FIGS. 8A to 8C, a first low-bandgap interfacial layer 170 may be formed on a dielectric layer 160.

Referring to FIG. 8A, a thin electrode layer 170E may be formed on the dielectric layer 160. The thin electrode layer 170E may be a component used in an intermediate operation/process for forming the first low-bandgap interfacial layer 170. The thin electrode layer 170E may be a component distinct from a lower electrode LE and an upper electrode UE. The thin electrode layer 170E may be an electrode layer having a smaller thickness than the lower electrode LE and the upper electrode UE. A thickness of the thin electrode layer 170E may be greater than about 0 Å and less than or equal to about 10 Å. The thin electrode layer 170E may include a metal film, a conductive metal oxide film, a conductive metal nitride film, a conductive metal oxynitride film, or a combination thereof.

Referring to FIG. 8B, a first metal oxide layer 170L may be formed to a small thickness on the thin electrode layer 170E. The first metal oxide layer 170L may be formed by depositing a first metal oxide 172 on the thin electrode layer 170E by using a CVD process, a MOCVD process, a PVD process, or an ALD process. The first metal oxide 172 may include a metal oxide having a bandgap energy of more than about 2.5 eV and less than or equal to about 3.5 eV.

Referring to FIG. 8C, the first low-bandgap interfacial layer 170 including a first low-bandgap interfacial region 171 and the first metal oxide 172 in the first low-bandgap interfacial region 171 may be formed. The first low-bandgap interfacial layer 170 may be formed by diffusing the first metal oxide 172 included in the first metal oxide layer 170L into the thin electrode layer 170E. In other embodiments, the first low-bandgap interfacial layer 170 may be formed by diffusing a first metal dopant 170*d* in the first metal oxide 172 into the thin electrode layer 170E. The first metal dopant 170*d*, which is diffused, may be oxidized again and present in the form of the first metal oxide 172 in the first low-bandgap interfacial region 171. The diffusion of the first metal oxide 172 or the first metal dopant 170*d* into the thin electrode layer 170E may be performed or promoted by using an annealing process. As a result, the thin electrode layer 170E may be combined with the first metal oxide layer 170L on the thin electrode layer 170E to form the first low-bandgap interfacial layer 170 including the first low-bandgap interfacial region 171 and first metal oxide 172.

Referring to FIGS. 9A and 9B, a first low-bandgap interfacial layer 170 may be formed on the dielectric layer

160. The present embodiment shown in FIGS. 9A and 9B may be different from that described with reference to FIGS. 8A to 8C.

Referring to FIG. 9A, a first low-bandgap interfacial region 171 may be formed on the dielectric layer 160. As described above, the first low-bandgap interfacial region 171 may be a region in which the first low-bandgap interfacial layer 170 is formed. The first low-bandgap interfacial region 171 may be a thin electrode layer. Thereafter, a first metal dopant 170*d* may be doped into the first low-bandgap interfacial region 171. The process of doping the first metal dopant 170*d* may include supplying the first metal dopant 170*d* by using a first metal dopant source (not shown) and diffusing the first metal dopant 170*d* into the first low-bandgap interfacial region 171.

Referring to FIG. 9B, the first metal dopant 170*d*, which is diffused, may be oxidized again and present in the form of a first metal oxide 172 in the first low-bandgap interfacial region 171. That is, the first low-bandgap interfacial layer 170 including the first low-bandgap interfacial region 171 and the first metal dopant 170*d*, which is in an oxidized state in the form of the first metal oxide 172 in the first low-bandgap interfacial region 171, may be formed.

FIGS. 10A to 10E are cross-sectional views of some operations/processes of a method of manufacturing the semiconductor device 10 having the second low-bandgap interfacial layer 180, according to the embodiments shown in FIG. 2B. The illustration of the same descriptions as those in the method of manufacturing the semiconductor device 10, which has been described with reference to FIGS. 6A to 6E, is omitted.

Figure 10A:
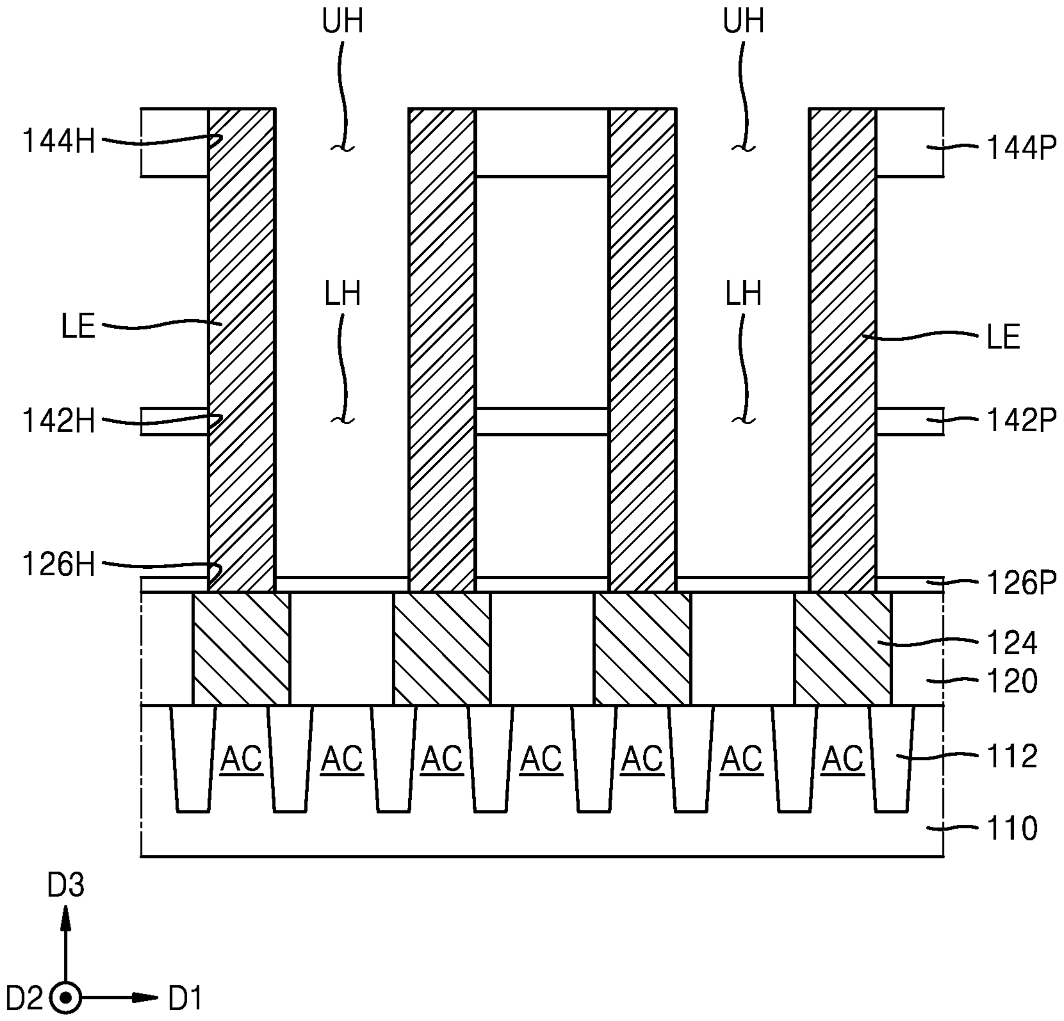
FIGS. 10A to 10E are cross-sectional views of some operations/processes of a method of manufacturing the semiconductor device according to the embodiments shown in FIG. 2B.

Referring to FIG. 10A, as a result of performing some operations/processes of the manufacturing method shown in FIGS. 6A to 6D, sidewalls and upper surfaces of the plurality of lower electrodes LE, some surfaces of a lower supporter 142P, an upper supporter 144P, and an insulating pattern 126P may be exposed.

Figure 10B:
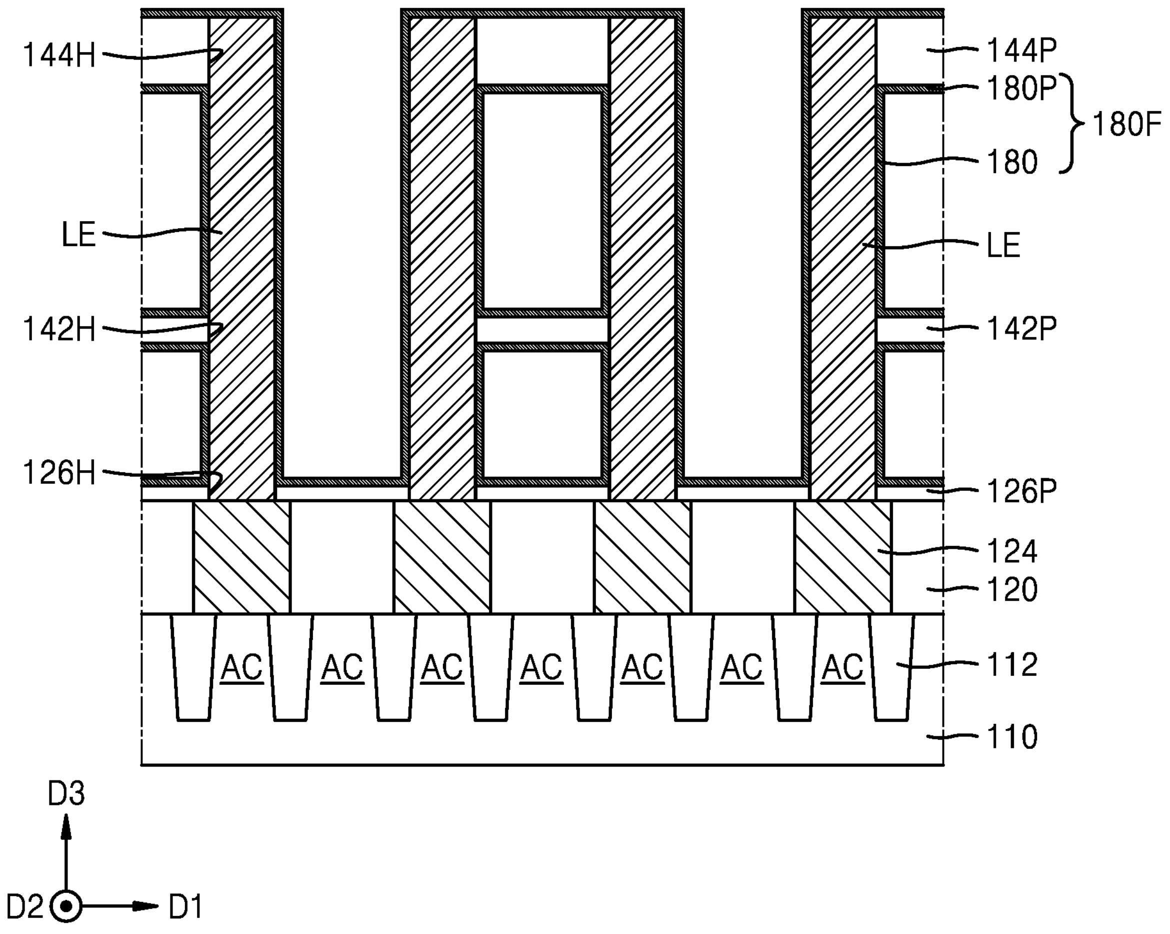

Referring to FIG. 10B, a pre-low-bandgap interfacial layer 180F may be formed to cover the exposed sidewalls and upper surfaces of the plurality of lower electrodes LE, some surfaces exposed of the lower supporter 142P, the upper supporter 144P, and the exposed surfaces of the insulating pattern 126P. The pre-low-bandgap interfacial layer 180F may be formed by depositing a metal oxide by using a CVD process, an MOCVD process, a PVD process, or an ALD process. The metal oxide may include a metal oxide having a bandgap energy of more than about 2.5 eV and less than or equal to about 3.5 eV. The pre-low-bandgap interfacial layer 180F may include a region to be later the second low-bandgap interfacial layer 180 and a region 180P to be removed. The second low-bandgap interfacial layer 180 may be formed on the exposed sidewalls and upper surfaces of the plurality of lower electrodes LE. The region 180P to be removed may be formed on the some surfaces exposed of the lower supporter 142P, the upper supporter 144P, and the exposed surfaces of the insulating pattern 126P.

Figure 10C:
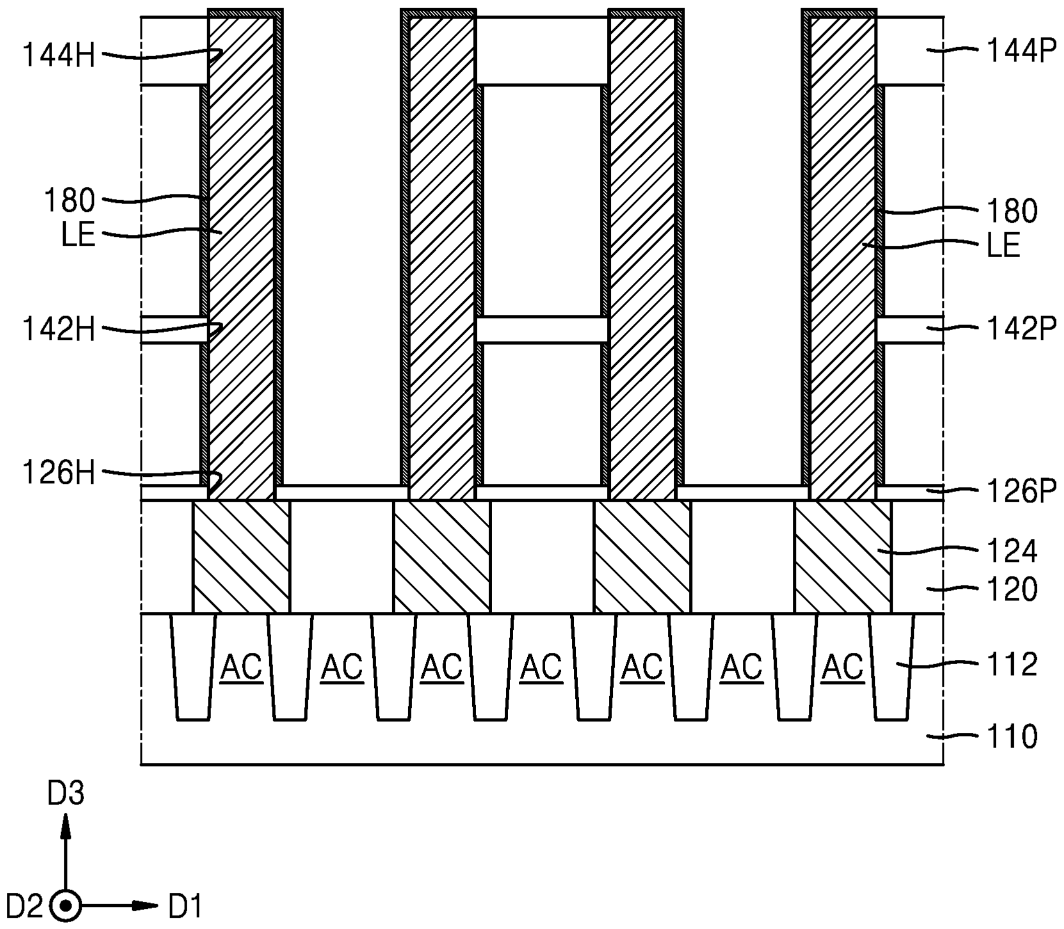

Referring to FIG. 10C, a portion (i.e., the region 180P) may be removed from the pre-low-bandgap interfacial layer 180F, which is formed on the some surfaces exposed of the lower supporter 142P, the upper supporter 144P, and the exposed surfaces of the insulating pattern 126P. The pre-low-bandgap interfacial layer 180F may be formed to a non-uniform thickness. For example, a thickness of the region to be the second low-bandgap interfacial layer 180 and a thickness of the region 180P to be removed may not be uniform. The portion (e.g., the region 180P) of the pre-low-bandgap interfacial layer 180F may be wet removed. As a result of the wet removal process, only the second low-bandgap interfacial layer 180 formed on the exposed sidewalls and upper surfaces of the plurality of lower electrodes LE may be left. That is, the second low-bandgap interfacial layer 180 including a metal oxide may be formed by using the wet removal process.

Figure 10D:
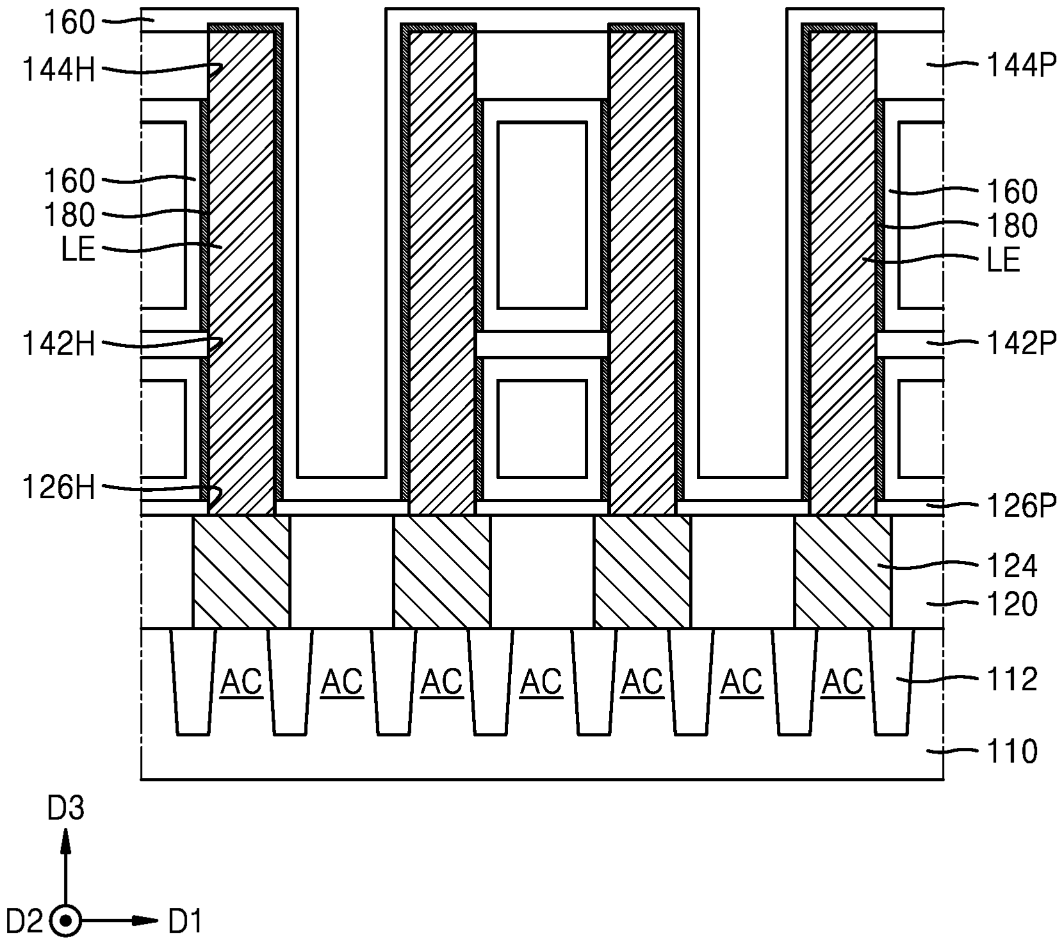

Referring to FIG. 10D, the dielectric layer 160 may be formed to cover the second low-bandgap interfacial layer 180. The dielectric layer 160 may be formed to cover not only the second low-bandgap interfacial layer 180, but also the exposed surfaces of each of the lower supporter 142P, the upper supporter 144P, and the exposed surfaces of the insulating pattern 126P. To form the dielectric layer 160, a CVD process, a PECVD process, an MOCVD process, or an ALD process may be used. After the dielectric layer 160 is deposited to cover the second low-bandgap interfacial layer 180, an annealing process may be performed. In embodiments, the annealing process may be performed at a temperature of about 200° C. to about 700° C. The crystallinity of the dielectric layer 160 may be improved due to the annealing process that may be performed on the resultant structure including the dielectric layer 160.

Figure 10E:
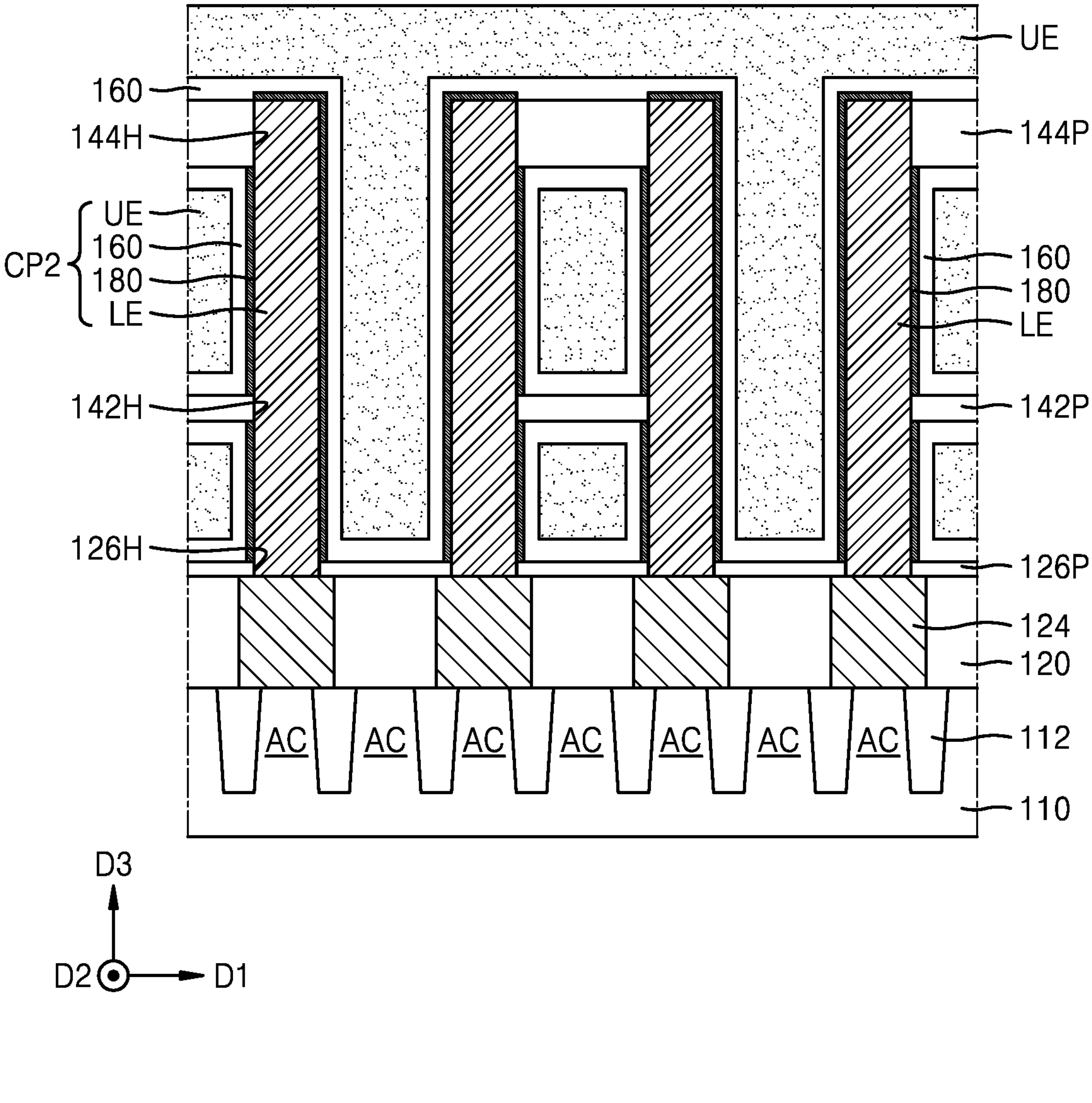

Referring to FIG. 10E, an upper electrode UE may be formed on the resultant structure of FIG. 10D, and thus, the semiconductor device 10 shown in FIG. 2B may be manufactured. In embodiments, to form the upper electrode UE, a CVD process, a MOCVD process, a PVD process, or an ALD process may be used.

Figure 11A:
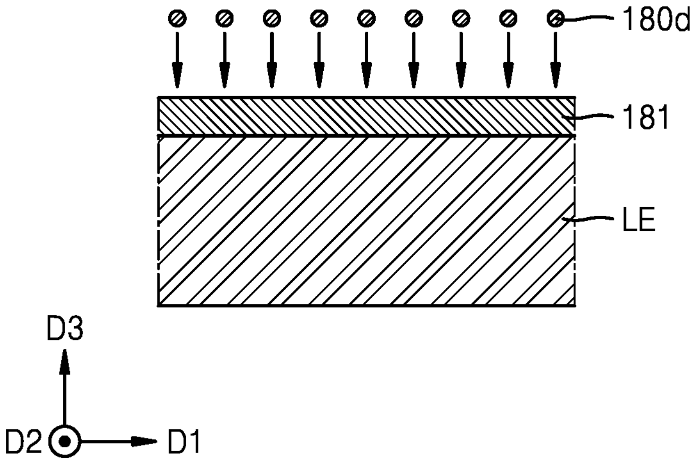
FIGS. 11A and 11B are cross-sectional views of some operations/processes of a method of manufacturing a semiconductor device, according to the embodiment shown in FIG. 4B.
Figure 11B:
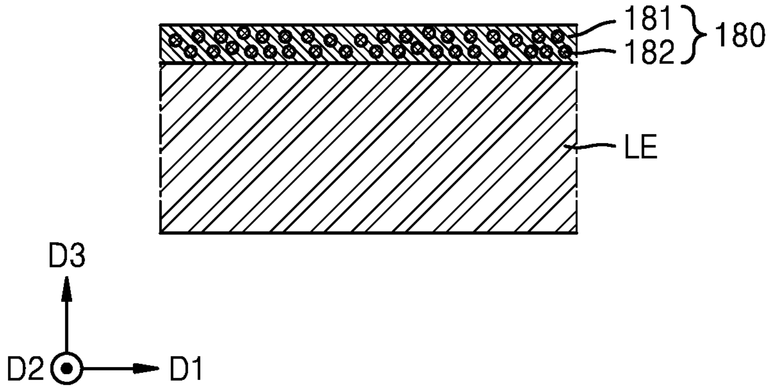

FIGS. 11A and 11B are cross-sectional views of an example of operation/process shown in FIG. 10B, of the method of manufacturing the semiconductor device 10 shown in FIGS. 10A to 10E. Specifically, FIGS. 11A and 11B are cross-sectional views of some operations/processes of a method of manufacturing the semiconductor device, according to the embodiments shown in FIG. 4B.

Referring to FIGS. 11A and 11B, a second low-bandgap interfacial layer 180 may be formed on a lower electrode LE.

Referring to FIG. 11A, a second low-bandgap interfacial region 181 may be formed on the lower electrode LE. As described above, the second low-bandgap interfacial region 181 may be a region in which the second low-bandgap interfacial layer 180 is formed. The second low-bandgap interfacial region 181 may be a thin electrode layer. Thereafter, a second metal dopant 180*d* may be doped into the second low-bandgap interfacial region 181. The process of doping the second metal dopant 180*d* may include supplying the second metal dopant 180*d* by using a second metal dopant source (not shown) and diffusing the second metal dopant 180*d* into the second low-bandgap interfacial region 181.

Referring to FIG. 11B, the second metal dopant 180*d*, which is diffused, may be oxidized again and present in the form of a second metal oxide 182 in the second low-bandgap interfacial region 181. That is, the second low-bandgap interfacial layer 180 including the second low-bandgap interfacial region 181 and the second metal dopant 180*d*, which is in an oxidized state in the form of the second metal oxide 182 in the second low-bandgap interfacial region 181, may be formed.

In other embodiments, the second low-bandgap interfacial region 181 may be a partial region of the lower electrode LE. Specifically, the second low-bandgap interfacial region 181 may be a partial region of the lower electrode LE, which is in contact with the dielectric layer 160. In this case, the second low-bandgap interfacial layer 180 may be formed by doping the second metal dopant 180*d* into a partial region of the lower electrode LE.

The second low-bandgap interfacial layer 180 may include the second low-bandgap interfacial region 181 and the second metal dopant 180*d*, which is in an oxidized state in the form of the second metal oxide 182 in the second low-bandgap interfacial region 181.

While the inventive concept has been particularly shown and described with reference to embodiments thereof, it will be understood that various changes in form and details may be made therein without departing from the scope of the following claims.

What is claimed is:

1. A semiconductor device comprising:

an upper electrode;

a lower electrode;

a dielectric structure, comprising a first dielectric layer and a second dielectric layer, between the upper electrode and the lower electrode, wherein the dielectric structure comprises a first metal oxide and wherein the first dielectric layer and the second dielectric layer are made of different materials;

a first low-bandgap interfacial layer between the first dielectric layer and the upper electrode, wherein the first low-bandgap interfacial layer comprises a second metal oxide having a bandgap energy of more than 2.5 eV and less than or equal to 3.5 eV, wherein the bandgap energy of the second metal oxide is lower than a bandgap energy of the first metal oxide, and a second low-bandgap interfacial layer between the dielectric structure and the lower electrode, wherein a thickness of the first low-bandgap interfacial layer is different from a thickness of the second low-bandgap interfacial layer.

2. The semiconductor device of claim 1, wherein the second metal oxide consists of cobalt oxide, tungsten oxide, vanadium oxide, copper oxide, titanium oxide, niobium oxide, iron oxide, or a combination thereof.

3. The semiconductor device of claim 1, wherein a thickness of the first low-bandgap interfacial layer is more than 0 angstroms (Å) and less than or equal to 10 Å.

4. The semiconductor device of claim 1, wherein a content ratio of the second metal oxide in the first low-bandgap interfacial layer is higher than a content ratio of the second metal oxide in the second low-bandgap interfacial layer.

5. The semiconductor device of claim 1, wherein the second metal oxide has a bandgap energy lower than a bandgap energy of $TiO_2$.

6. The semiconductor device of claim 1, wherein a total thickness of the dielectric structure is more than 0 Å and less than or equal to 60 Å.

7. The semiconductor device of claim 1, wherein the first dielectric layer comprises a ferroelectric material layer and the second dielectric layer comprises a paraelectric material layer.

8. A semiconductor device comprising:

a substrate;

an active region defined by a device isolation film in the substrate;

a word line intersecting with the active region, the word line extending in a first direction in the substrate;

a bit line extending in a second direction on the substrate, the second direction intersecting with the first direction; and a capacitor on the bit line, wherein the capacitor comprises:

an upper electrode, a lower electrode, and a dielectric structure, comprising a first dielectric layer and a second dielectric layer, between the upper electrode and the lower electrode, wherein the dielectric structure comprises a first metal oxide and wherein the first dielectric layer and the second dielectric layer are made of different materials;

a first low-bandgap interfacial layer between the first dielectric layer and the upper electrode, wherein the first low-bandgap interfacial layer comprises a second metal oxide having a bandgap energy of more than 2.5 eV and less than or equal to 3.5 eV, wherein the bandgap energy of the second metal oxide is lower than a bandgap energy of the first metal oxide, and a second low-bandgap interfacial layer between the dielectric structure and the lower electrode, wherein a thickness of the first low-bandgap interfacial layer is different from a thickness of the second low-bandgap interfacial layer.

9. The semiconductor device of claim 8, wherein the second metal oxide consists of cobalt oxide, tungsten oxide, vanadium oxide, copper oxide, titanium oxide, niobium oxide, iron oxide, or a combination thereof.

10. The semiconductor device of claim 8, wherein a content ratio of the second metal oxide in the first low-bandgap interfacial layer is higher than a content ratio of the second metal oxide in the second low-bandgap interfacial layer.

11. The semiconductor device of claim 8, wherein a total thickness of the dielectric structure is more than 0 angstroms (Å) and less than or equal to 60 Å.

12. The semiconductor device of claim 8, wherein the first dielectric layer comprises a ferroelectric material layer and the second dielectric layer comprises a paraelectric material layer.

13. A semiconductor device comprising:

a substrate;

an active region defined by a device isolation film in the substrate;

a word line intersecting with the active region, the word line extending in a first direction in the substrate;

a bit line extending in a second direction on the substrate, the second direction intersecting with the first direction; and a capacitor on the bit line, wherein the capacitor comprises:

an upper electrode, a lower electrode, and a dielectric structure, comprising a first dielectric layer and a second dielectric layer, between the upper electrode and the lower electrode, wherein the dielectric structure comprises a first metal oxide and wherein the first dielectric layer and the second dielectric layer are made of different materials;

a first low-bandgap interfacial layer between the first dielectric layer and the lower electrode, wherein the first low-bandgap interfacial layer comprises a first metal dopant comprising a second metal oxide having a bandgap energy of more than 2.5 eV and less than or equal to 3.5 eV, wherein the bandgap energy of the second metal oxide is lower than a bandgap energy of the first metal oxide, and a second low-bandgap interfacial layer between the dielectric structure and the lower electrode, wherein a thickness of the first low-bandgap interfacial layer is different from a thickness of the second low-bandgap interfacial layer.

14. The semiconductor device of claim 13, wherein a content ratio of the first metal dopant in the capacitor is more than 0 atomic percent % and less than or equal to 5%.

15. The semiconductor device of claim 13, wherein the first metal dopant consists of cobalt, tungsten, vanadium, copper, titanium, niobium, iron, or a combination thereof.

16. The semiconductor device of claim 13, wherein the second low-bandgap interfacial layer comprises a second metal dopant comprising a third metal oxide having a bandgap energy of more than 2.5 eV and less than or equal to 3.5 eV, and a content ratio of the first metal dopant is higher than a content ratio of the second metal dopant.

17. The semiconductor device of claim 13, wherein a total thickness of the dielectric structure is more than 0 angstroms (Å) and less than or equal to 60 Å.

18. The semiconductor device of claim 13, wherein the first dielectric layer comprises a ferroelectric material layer and the second dielectric layer comprises a paraelectric material layer.

* * * * *